United States Patent
Heo

(10) Patent No.: US 9,263,502 B2
(45) Date of Patent: Feb. 16, 2016

(54) ORGANIC LIGHT EMITTING ELEMENT, ORGANIC LIGHT EMITTING DISPLAY DEVICE, AND METHOD OF MANUFACTURING THE ORGANIC LIGHT EMITTING DISPLAY DEVICE

(71) Applicant: LG Display Co., Ltd., Seoul (KR)

(72) Inventor: JoonYoung Heo, Seoul (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 14/095,520

(22) Filed: Dec. 18, 2013

(65) Prior Publication Data
US 2014/0183471 A1    Jul. 3, 2014

(30) Foreign Application Priority Data
Dec. 28, 2012 (KR) .................. 10-2012-0155868

(51) Int. Cl.
H01L 27/32    (2006.01)
H01L 51/50    (2006.01)
H01L 51/52    (2006.01)

(52) U.S. Cl.
CPC ............ *H01L 27/322* (2013.01); *H01L 51/504* (2013.01); *H01L 51/5278* (2013.01)

(58) Field of Classification Search
CPC .. H01L 27/322; H01L 51/504; H01L 51/5278
USPC ........................................................ 257/40
See application file for complete search history.

(56) References Cited

U.S. PATENT DOCUMENTS

| | | | |
|---|---|---|---|
| 8,258,691 B2 | 9/2012 | Lee et al. | |
| 2003/0068524 A1* | 4/2003 | Hatwar ................. | 428/690 |
| 2003/0170491 A1* | 9/2003 | Liao et al. .................... | 428/690 |
| 2005/0088085 A1 | 4/2005 | Nishikawa et al. | |
| 2006/0238118 A1* | 10/2006 | Spindler ................. | C09K 11/06 313/506 |
| 2009/0146560 A1* | 6/2009 | Kim et al. ........... | H01L 51/5036 313/506 |
| 2010/0093121 A1* | 4/2010 | Li et al. ............... | 438/29 |
| 2011/0057187 A1* | 3/2011 | Sakakura ............ | H01L 27/1225 257/43 |

(Continued)

FOREIGN PATENT DOCUMENTS

| KR | 10-2010-0068074 A | 6/2010 |
| KR | 10-2010-0068123 A | 6/2010 |
| KR | 10-2012-0080856 A | 7/2012 |

OTHER PUBLICATIONS

International Search Report and Written Opinion for PCT/KR2013/012074, Apr. 14, 2014, 3 Pages.

*Primary Examiner* — Marc Armand
*Assistant Examiner* — Wasiul Haider
(74) *Attorney, Agent, or Firm* — Fenwick & West LLP

(57) ABSTRACT

A white organic light emitting element, a white organic light emitting display device, and a method of manufacturing the white organic light emitting element are provided. The organic light emitting element includes a multi-layered emission layer structure. The multi-layered emission layer structure includes a first electroluminescent layer and a second electroluminescent layer that are arranged to overlap at first area of the white organic light emitting element. The lights from the first and second electroluminescent layers collectively form white light. Among the first and second electroluminescent layers, one of the EL layers is extended out to the second area of the white organic light emitting element. A plurality of color filter elements are used to filter the white light to generate colored lights at the corresponding sub pixel regions.

18 Claims, 19 Drawing Sheets

(56) References Cited

U.S. PATENT DOCUMENTS

| | | | |
|---|---|---|---|
| 2011/0073853 A1* | 3/2011 | Smith | 257/40 |
| 2011/0175101 A1* | 7/2011 | Hatano et al. | 257/72 |
| 2012/0236016 A1* | 9/2012 | Fujino | 345/589 |
| 2012/0298968 A1 | 11/2012 | Kim et al. | |

* cited by examiner

US 9,263,502 B2

ORGANIC LIGHT EMITTING ELEMENT, ORGANIC LIGHT EMITTING DISPLAY DEVICE, AND METHOD OF MANUFACTURING THE ORGANIC LIGHT EMITTING DISPLAY DEVICE

CROSS-REFERENCE TO RELATED APPLICATION

This application claims priority to and the benefit of Korean Patent Application No. 2012-0155868, filed on Dec. 28, 2012, the disclosure of which is incorporated herein by reference in its entirety.

BACKGROUND

1. Field of the Invention

The present invention relates to an organic light emitting element (referred hereinafter as "OLED element") with improved light output rate, power consumption and lifespan and organic light emitting device employing the OLED element, as well as a method of manufacturing such OLED element and device.

2. Discussion of Related Art

An organic light emitting diode device (sometimes referred to as OLED device) is a self-emitting display device. Unlike the liquid crystal display (LCD) display device, it does not require an additional light source, and thus the OLED device can have much thinner and lighter profile than the LCD display device. Not only is the OLED device consumes less power than the typical LCD based display device, it provides better color accuracy, faster response rate, greater viewing angle, and higher contrast ratio (CR). Accordingly, a lot of research has been performed into developing more efficient emissive materials and OLED structures.

An OLED device commonly includes a substrate, an anode, a hole-transporting layer made of an organic compound, an organic luminescent layer with suitable dopants, an organic electron-transporting layer, and a cathode. When current is applied, electrons flow from the cathode to the anode. That is, the cathode provides electrons into the electroluminescent layer (EL layer), while the anode removes electrons from the EL layer, leading to holes in the EL layer. The electrons provided from the cathode combine with the holes in the EL layer and create excitons. This process releases photons, and thus light is generated. Different types of emissive materials can be used to change the color of the light. The intensity of the light is controlled by the amount of current applied.

Some OLED device employs organic light emitting elements configured with different luminescent layer(s) to emit a designated color of light (e.g., red, green, or blue) at a corresponding sub pixel region. In such OLED device, each OLED element emits designated color without using color filter elements, high luminance can be obtained from the OLED element. However, this type of OLED device (referred hereinafter as "RGB type") requires the OLED elements to be disposed according to the sub pixel design of the display device, thereby severely limiting its application.

Unlike the RGB type, some OLED device employs white light producing luminescent layer in conjunction with red, green and blue color filter elements at the red, green and blue sub pixel regions (referred hereinafter as "RGBW type"). This configuration makes it easy to fabricate the OLED device for a variety of applications.

There is a tradeoff between the color saturation, the driving current, the luminance and the lifetime of the OLED device. In case of RGBW type OLED, the luminance of the OLED element is sacrificed as the white light from the OLED element passes through the color filter elements. In order to compensate the reduced luminance, higher current density is provided. Such increase in current density, however, leads to shortened lifetime of OLED element and undesirable color shifts as the display device ages.

Further, the color coordinates of the white light emitted from the OLED element can be distorted if the luminance of a certain emission layer becomes lower than the luminance of the other emission layers or the color coordinate of a certain emission layer deviates from its initial preferred setting. For example, if the luminance of an EL layer that emits blue light is lower than that of the other EL layers that emit other colored light, the OLED element may not emit the white light with the ideal color coordinate.

The driving voltage of the OLED element can be adjusted to correct such color coordinate shift caused by a certain emission layer. However, not only is the algorithm for correcting color coordinates require very complicated arithmetic operations, this method often involves increasing the current level at the white sub pixel region as well as some of the other pixel regions in order to correct the overall color saturation. This results in increased power consumption of the entire panel and reduced lifespan of the EL layer. Using a low-power driving algorithm following the aforementioned calibration significantly complicates the overall operation. Even if such algorithms can be performed, other side effects may occur.

Accordingly, there remains a need for white OLEDs having excellent emission efficiency and long life-spans.

SUMMARY OF THE INVENTION

A white OLED element can be designed with two or more EL layers. Lights emitted from a plurality of EL layers are combined to form white light. The inventors of the present invention has recognized that when white light passes through color filters, the white light is absorbed by the color filter elements, thereby lowering the efficiency of an OLED element. In particular, in the case of white light passing through a blue color filter element, the inventor has recognized that efficiency of the blue light is sharply decreased according to the transmittance of the color filter element.

Accordingly, a display device with improved emission efficiency and increased life-span is provided. The display device includes a multi-layered emission layer structure having a blue electroluminescent (EL) layer and a complementary EL layer. The blue EL layer is configured to emit substantially blue light (e.g., light with a wavelength between from about 380 nm to about 495 nm, more preferably from about 450 nm to about 495 nm, referred hereinafter as "blue light") at one part of the multi-layered emission layer structure, and the complementary EL layer is configured to emit light that complements the blue light such that the blue light from the blue EL layer and the light emitted from the complementary EL layer collectively form substantially white light at another part of the multi-layered emission layer structure. The complementary EL layer is not disposed in the part of the multi-layered emission layer structure relative to the blue pixel of the display device. The order in which the blue EL layer and the complementary EL layer are disposed within the multi-layered emission layer structure can vary depending on the emission type of the OLED element (e.g., top-emission, bottom-emission) employed by the display device.

The display device further includes a red color filter element and a green color filter element that are positioned to filter the white light from multi-layered emission layer structure to generate red and green light, respectively. The display device has a plurality of pixels such as one or more of red pixels, one or more of green pixels and one or more of blue pixels. The white light emitted from the part of the multi-layered emission layer structure is filtered through the red color filter element and transmitted at the red pixel(s) of the display device. Similarly, the white light emitted from the part of the multi-layered emission layer structure is filtered through the green color filter element and transmitted at the green pixel(s) of the display device. At the blue pixel(s), however, the blue light emitted from the part of the multi-layered emission layer structure is transmitted.

In this setting, the blue pixel of the display device does not transmit blue light generated by filtering the white light from the multi-layered emission layer structure. Instead, the blue light from the blue EL layer of the multi-layered emission layer structure can be transmitted at the blue pixel of the display device without being filtered by a color filter element, and thereby increase the luminance of the blue light without increasing the driving voltage/current.

Further, some embodiments of the display device may include a blue color filter element that filters the blue light emitted from the blue EL layer and transmit the filtered light at the blue pixel(s) of the display device. By using the blue color filter element, the saturation and/or color coordinate of the blue light from the blue EL layer can be adjusted more precisely. This also provides greater flexibility in pixel layout designs as well as improvement in overall color accuracy of the white OLED element. Unlike the situation where white light is filtered by a blue color filter element to generate blue colored light, the luminance of the blue light is substantially maintained because the blue light from the blue EL layer is being filtered by the blue color filter element.

In some embodiments, the complementary EL layer is disposed in the part of the multi-layered emission layer structure relative to the red and green pixels. The blue EL layer is disposed on the complementary EL layer to overlap with the complementary EL layer and extends further into the other part of the multi-layered emission layer structure. In other words, the part of the multi-layered emission layer structure that emits the white light has the blue EL layer disposed on top of the complementary EL layer while the part that emits the blue light has does not have complementary EL layer disposed therein.

Alternatively, in some other embodiments, the blue EL layer is disposed in both parts of the multi-layered emission layer structure, and the complementary EL layer is disposed on a part of the blue EL layer. The overlapping part of the multi-layered emission layer structure emits light from the blue and complementary EL layers to collectively form the white light, whereas the non-overlapping part of the multi-layered emission layer structure emit the blue light from the blue EL layer.

The blue EL layer as well as the complementary EL layer of the multi-layered emission layer structure may be formed of one or more of EL layers with one or more of organic materials. In some embodiments, the complementary EL layer includes a host doped with a red dopant and a green dopant. In some other embodiments, the complementary EL layer is made of a stack of a red EL layer and a green EL layer. Also, in some other embodiments, the complementary EL layer is made of a stack of an EL layer doped with a red phosphor dopant and another EL layer doped with a yellow phosphor dopant, whereas the blue EL layer of the multi-layered emission layer structure is doped with a blue fluorescent dopant.

In some embodiments, the multi-layered emission layer structure may include a charge generation layer (CGL) interposed between the blue EL layer and the complementary EL layer. The CGL may be composed of an n-doped layer and a p-doped layer for injection of electrons and holes, respectively. When the OLED element of the display device is turned on, electrons and holes are supplied from the CGL to start the EL layers for electroluminescence. At the subsequent stage, the consumed electrons and holes in the CGL are refilled by the electrons and holes injected from the cathode and anode, respectively.

The plurality of pixels employed by some embodiments of the display device may include one or more of white pixels. In the white pixels, the white light emitted from the part of the multi-layered emission layer structure is transmitted without being filtered by color filter elements. In some embodiments, however, the white light from the multi-layered emission layer structure may be passed through a transparent resin layer, which may protect the EL layers and/or planarize the surface of the multi-layered emission layer structure. Similar to the unfiltered blue light transmitted at the blue pixel of the display device, unfiltered white light transmitted at the white pixel may be utilized in calibrating the overall luminance and the color saturation of the display device.

Also, in some embodiments, the display device may include individually addressable anode in each of the plurality of pixels so that the part of the multi-layered emission layer structure relative to a specific pixel of the display device can be separately driven.

In another aspect, the present invention is directed to a white OLED element with improved emission efficiency and increased life-span. The white OLED element includes at least two areas. In each of the areas, at least one anode is disposed therein. The anodes in the first and second areas are individually addressable such that the part of the white OLED element at each of the anodes can be separately controlled (e.g., EL layers on the individual anode can be separately activated to emit light). Further, a blue EL layer for emitting substantially blue light is disposed on the first and second areas of the white OLED element. Additionally, a complementary EL layer, which is configured to emit light complementary to the blue light, is disposed on the first area of the white OLED element. Accordingly, in the first area, the light from the blue EL layer and the light from the complementary EL layer are combined to form white light. The white OLED element further includes a cathode disposed in both the first and second areas to provide electrons to the EL layer(s) in the respective area of the white OLED element. At least one color filter element is included in the white OLED element to filter at least some of the combination of light from the blue and complementary EL layers (i.e., the white light), and transmit colored light corresponding to the color filter element. In the second area, the blue light emitted from the blue EL layer is substantially unaffected by the light emitted from the complementary EL layer disposed in the first area of the white OLED element. That is, the shift in the wavelength value of the blue light emitted at the second area is less than 100 nm, more preferably by less than 50 nm, more preferably by less than 30 nm, and even more preferably by less than 10 nm.

In some other embodiments, the complementary EL layer is made of multiple EL layers that include a red EL layer that emits substantially red light (e.g., light with a wavelength between from about 580 nm to about 750 nm, more preferably from about 590 nm to about 750 nm, and more preferably from about 620 nm to about 750 nm), and a green EL layer that emits substantially green light (e.g., light with a wavelength between from about 496 nm to about 579 nm and more preferably from about 496 nm to 570 nm). In this setting, the combination of the red light from the red EL layer, the green light from the EL layer and the blue light from the blue EL layer, collectively, forms the white light. This white light is utilized in all pixels except the blue pixel of a display device where the complementary EL layer is not disposed thereon.

Also, in some other embodiments, the complementary El layer is made of multiple EL layers that include an EL layer doped with a red phosphor dopant and an EL layer doped with a yellow phosphor dopant. The blue light EL layer is doped with a blue fluorescent dopant, and the light emitted from these EL layers are combined to form the white light at the pixels excluding the blue pixel.

Some embodiments of the white OLED element include a white pixel, which is configured to transmit the white light from the multi-layered emission layer structure. As mentioned above, the white light at the white pixel can be utilized in correcting various properties of the white OLED element.

Further, some embodiments of the white OLED element include a blue color filter element that filters the blue light emitted from the blue EL layer. By using the blue color filter element, the saturation and/or color coordinate of the blue light from the blue EL layer can be adjusted more precisely. This provides greater flexibility in pixel layout designs as well as improvement in overall color accuracy of the white OLED element. Unlike the situation where white light is filtered by a blue color filter element to generate blue colored light, the luminance of the blue light is substantially maintained because the blue light from the blue EL layer is being filtered by the blue color filter element.

The white OLED element may be configured as a bottom emission type OLED element. In this setting, the lights from the blue EL layer and the complementary EL layer exit through the anodes disposed in the first and the second areas of the white OLED element. Alternatively, the white OLED element is configured as a top emission type OLED element. In this setting, the light from the blue EL layer and the complementary EL layer exits from the white OLED element through the cathode disposed in the first and the second areas of the white OLED element. Further, in some embodiments, the white OLED element may be configured to emit light in both top and bottom directions. The improved luminance and color saturation achieved by the white OLED of the present disclosure can be especially useful in a transparent display device, which may employ such dual emission type white OLED element.

The configuration of EL layers in the multi-layered emission layer structure is not limited to the specific exemplary embodiments of the present disclosure, but may vary by considering various properties of the EL layers that form the multi-layered emission layer structure without departing the spirit of the present invention. The properties of the EL layers that can be considered in configuring the EL layers within the multi-layered emission layer structure may include, but are not limited to, the luminance, the color accuracy, the power consumption, the life span and various other factors of the individual EL layers and/or the multi-layered emission layer as a whole.

Accordingly, in one other aspect, the present invention is directed to a display device having a multi-layered emission layer structure including at least a part being configured to emit a light from a principal EL layer and at least at one other part configured to emit a combination of light emitted from the principal EL layer and the complementary EL layer. The light from the principal EL layer has a wavelength value of a predetermined range. The light from the complementary EL layer is complementary relative to the light emitted from the principal EL layer so that the combination of light from the principal EL layer and the complementary EL layer is substantially white light. One or more of color filter elements are used to filter the white light emitted from the part of the multi-layered emission layer structure. At least one of a red pixel, a green pixel and a blue pixel is configured to transmit the white light that is filtered through a corresponding color filter element. For instance, the principal EL layer may be configured to emit red colored light and transmitted at the red pixel of the display device. In this setting, the white light generated by combining the light emitted from the principal EL layer and the light emitted from the complementary EL layer is filtered through blue and green color filter elements to generate blue and green light to be transmitted at the blue and green pixels of the display device, respectively.

As mentioned, the principal EL layer may emit other colored light, such as green or blue colored light. It is sufficient that the principal EL layer covers larger area in the multi-layered emission layer than the complementary EL layer such that the portion of the principal EL layer being extended out from the area covered by the complementary EL layer can emit the principal EL layer's constituent colored light without being substantially affected by the light from the complementary EL layer. That is, the shift in the wavelength value of the blue light emitted at the second area is 100 nm, more preferably less than 50 nm, more preferably less than 30 nm, and even more preferably by less than 10 nm.

In yet another aspect, the present invention is directed to a method of manufacturing a display device with improved emission efficiency and increased life-span. First, a plurality of anodes is formed on a substrate so that each of the anodes is individually addressable. Then, a first electroluminescent (EL) layer and a second electroluminescent (EL) layer are formed on the anodes such that at least a part of the first EL layer and the second EL layer are overlapped at the first area (e.g., an area for emitting substantially white light) of the display device. Here, at least one of the first EL layer or the second EL layer should be formed such that it is extended out to a second area (e.g., an area for emitting constituent colored light of the EL layer) without being overlapped with the other EL layer. A cathode is formed on both the first area and the second area so that the first EL layer and the second EL layer are interposed between the plurality of anodes and the cathode. Then, one or more of color filter elements are arranged to filter the light emitted from the first area.

In this setting, the EL layer being extended out to the second area may emit its own colored light without being filtered by a color filter element while the stack of the first and second EL layers in the first area emits substantially white light, which is to be filtered by one or more of the color filter elements to generate colored light corresponding to the color filter element.

When forming the first and second EL layers, one of the first and second EL layers, which is to be extended out into the second area may be formed first. Then a photoresist may be formed on the EL layer in the second area. The photoresist in the second area is then developed. Following the development of the photoresist, the other EL layer that is to be left in the first area (i.e., complementary EL layer) is formed in the first and second areas. When the photoresist formed in the second area is stripped, the complementary EL layer formed in the second area is also stripped, thereby forming a multi-layered emission layer structure having the first area for emitting white light and the second area for emitting colored light of the EL layer. In some embodiments of the method, the photoresist developing solution and/or the photoresist stripper used in the process of forming the multi-layered emission layer structure contain fluorine, which may reduce the damage to the EL layers during the formation of the multi-layered emission layer structure.

As an alternative way of forming the multi-layered emission layer structure, one of the first and second EL layers can be formed in the first area, and the other EL layer can be formed on the EL layer in both the first and second areas. This method also results in a multi-layered emission layer structure with a stack of the first and second EL layers disposed in the first area for emitting the substantially white light and one of the first and second EL layers being extended into the second area for emitting colored light of the EL layer in the second area.

In one embodiment, the EL layer being extended out into the second area is an EL layer configured to emit substantially blue light, and the other EL layer, which is contained within the first area, is an EL layer configured to emit light having a color complementary to the blue light from the other EL layer. Accordingly, these two EL layers overlap at the first area and collectively emit substantially white light. In this embodiment, the plurality of color filter elements comprises a red color filter element and a green color filter element that are configured to filter the white light to generate red and green light, respectively. In other embodiments, the EL layer being extended out into the second area may be configured to emit substantially red or substantially green colored light, and the other EL layer being contained within the first area may be configured to emit light that is complementary to the red or green colored light. As such, the display device having a multi-layered emission layer structure with improved luminance, color accuracy, power consumption as well as the longer life span can be provided.

Additional features of the invention will be set forth in the description, which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which constitute a part of this specification, illustrate various embodiments of the present invention.

Figure 1A:
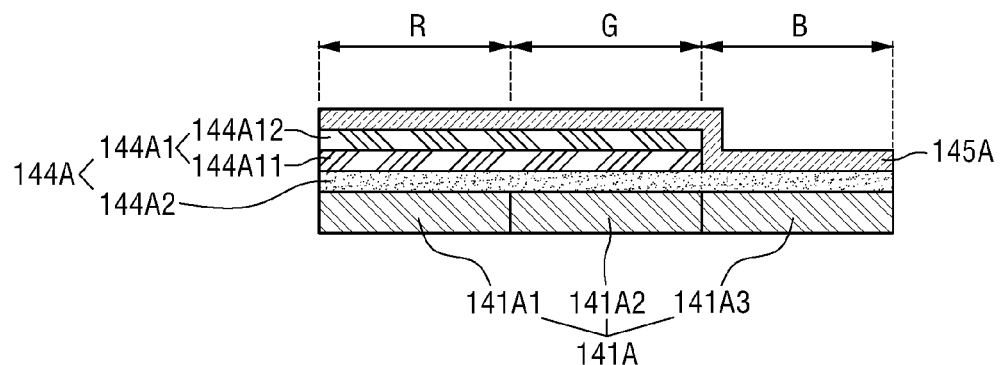
FIGS. 1A to 1C, each illustrates a cross-sectional view of an exemplary white OLED element according to an embodiment of the present invention.

It is noted that the drawings of the present application are provided for illustrative purposes only and, as such, the drawings are not drawn to scale. In the drawings, the size and relative sizes of layers and regions may be exaggerated for clarity. Like reference numerals in the drawings denote like elements.

DETAILED DESCRIPTION OF EXEMPLARY EMBODIMENTS

The present invention, which provides an organic light emitting element with improved luminance efficiency and lifetime, and methods of fabricating such an organic light emitting element, will now be described in greater detail by referring to the following discussion and drawings that accompany the present application.

In the following description, numerous specific details are set forth, such as particular structures, components, materials, dimensions, processing steps and techniques, in order to provide an understanding of the various embodiments of the present disclosure. In other instances, well-known structures or processing steps have not been described in detail in order to avoid obscuring the present disclosure.

It will be understood that when an element as a layer, region or substrate is referred to as being "on" another element, it can be directly on the other element or intervening elements may also be present. In contrast, when an element is referred to as being "directly on" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Further, it will be understood that when an element is referred to as being "overlapped" with another element, one element can be positioned above the other element or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

In the present disclosure, the organic light emitting display device includes one or more OLED elements, which can be configured to operate in one of a top, bottom or dual emission mode, depending on the direction light exits the OLED element. Accordingly, in the present disclosure, an OLED element is classified as bottom emission mode OLED element if the light emitted from the OLED element passes through a transparent or a semi-transparent bottom electrode and substrate on which the panel was manufactured. Also, an OLED element is classified as a top emission mode OLED element if the light emitted from the OLED element exits through a transparent or a semi-transparent top electrode. An OLED element can be classified as a dual emission mode OLED element if the light emitted from the OLED element exits through both the top and bottom electrodes to emit light on both sides of the OLED element. The components of the organic light emitting display device including, but not limited to, a thin film transistor, an anode, and a cathode as well as the structure of organic EL layer design, may be configured differently based on the aforementioned emission modes without departing from the spirit of the present invention.

Exemplary embodiments of the present application will now be described in greater detail by referring to the following discussion and drawings that accompany the present application.

FIG. 1A is a pictorial representation (through a cross sectional view) depicting a white OLED element 140A that can be employed in one embodiment of the present application. FIG. 1A illustrates the white OLED element 140A, which includes a plurality of anodes 141A1, 141A2 and 141A3 (collectively denoted as 141A), a multi-layered emission layer structure 144A having a plurality of EL layers 144A1 and 144A2, and a cathode 145A.

The anode is an electrode configured to provide holes in the EL layers, and may also be referred to as a positive electrode, a pixel electrode or a first electrode. The white OLED element 140A is configured to emit light when holes supplied from the anode 141A and electrons supplied from the cathode 145A are recombined in the EL layer(s) (144A1, 144A2). As described above, the anode 141A is configured to supply holes, and is thus formed of a conductive material having a high work function. Specifically, a material of the anode may depend on a light emission mode of the OLED element 140A. For example, in a top emission mode OLED element, the anode 141A can be formed of a material having high light reflective property, or formed with a material having transparent property with a reflective metal layer formed thereunder. In contrast, in a bottom emission mode OLED element, the anode 141A is formed as a transparent electrode without the reflective metal layer.

As mentioned above, the white OLED element 140A includes a first anode 141A1, a second anode 141A2 and a third anode 141A3. In this example, the first anode 141A1 is formed in an area relative to the first pixel region R, the second anode 141A2 is formed in an area relative to the second pixel region G, and the third anode 141A3 is formed in an area relative to the third pixel region B. The first anode 141A1, the second anode 141A2, and the third anode 141A3 are individually addressable. In other words, each anode can be independently driven to emit light in the corresponding pixel region. The one or more of the first, second and third pixels may form a unit pixel of the display device. Although the configuration of the pixels R, G and B are shown as in the specific order in linear fashion, it should be noted that the configuration (e.g., order, location, shape, etc.) of the pixels R, G and B may vary in a number of ways according to the display device employing the white OLED element.

The cathode 145A is formed on the multi-layered light emission layer structure 144A. The cathode 145A may be also referred to as a negative electrode, a common electrode, or a second electrode. The cathode 145A is formed on each of the first, second and the third pixel regions. The cathode 145A is connected to an additional voltage wire to apply the same voltage to all the sub pixel regions. The cathode 145A may or may not be patterned in units of the sub pixel regions.

As described above, the cathode 145A is configured to supply electrons and is thus formed of a material having high electrical conductivity and a low work function, i.e., a material of a cathode. Similar to the anode 141A, the material of the cathode 145A can vary depending on the light emission type of an OLED element. For example, in a top emission type OLED element, the cathode 145A may be formed of a very thin metal material having a low work function. In a bottom emission type OLED element, the cathode 145A may be formed of a conductive material having a low work function and high reflectivity.

The multi-layered emission layer structure 144A may have a structure including a hole injection layer (HIL), a hole transport layer (HTL), a plurality of EL layers, an electron transport layer (ETL), and an electron injection layer (EIL) that are sequentially stacked. Each EL layer within the multi-layered emission layer structure 144A emits light having a different wavelength such that the light of the individual EL layers collectively form white light. In this case, the plurality of EL layers are arranged to overlap each other at a part of the OLED element 140A except excluding at least one part of the OLED element 140A.

The multi-layered emission layer structure 144A includes a first EL layer 144A1 and a second EL layer 144A2. The first EL layer 144A1 emits first colored light, and the second EL layer 144A2 emits second colored light. In the present disclosure, the example shown in FIG. 1A will be described as if the light emitted from the second EL layer 144A2 is blue. Since a part of the multi-layered emission layer structure 144A emits substantially white light, the first color emitted from the first EL layer 144A1 is a color that can form white light when it is combined with the blue light of the second EL layer 144A2. In other words, the wavelength of the light from the first EL layer 144A1 and the wavelength of the light from the second EL layer 144A2 complement each other. In the present disclosure, the term "substantially white light" refers to light that is a mixture of wavelengths of various colors and is perceived as colorless, which may be referred hereinafter as "white light".

For convenience of explanation, white OLED element 140A of the present disclosure is illustrated with only the first EL layer 144A1 and the second EL layer 144A2 that emit light that collectively form the white light. Also, in FIG. 1A, the first EL layer 144A1 is illustrated as a single EL layer emitting the first colored light (e.g., light with a color complementary to the second colored light). However, it should be appreciated that the first EL layer 144A1 can be formed with multiple layers, which emit distinct colors of lights to form the first colored light. Accordingly, in some embodiments, the first EL layer 144A1 may be an EL layer in which a host is doped with a red dopant and a green dopant, and the second EL layer 144A2 is a blue EL layer. Here, the host means a material that generates excitons from electrons and holes and that does not emits light but delivers energy to the dopant, and the dopant means a material that is added in a small amount to the host and that receives energy from the host to transforms the energy into light.

In some embodiments, the first EL layer 144A1 includes a stack of a yellow EL layer and a green EL layer, and the second EL layer 144A2 is a blue EL layer. The yellow EL layer of the first EL layer 144A1 may be disposed above or below the green EL layer of the first EL layer 144A1. Also, in some embodiments, the first EL layer 144A1 includes a stack of a red EL layer 144A11 and a green EL layer 144A12, and the second EL layer 144A2 is a blue EL layer. Within the first EL layer 144A1, the red EL layer may be formed above or below the green EL layer. In some embodiments, the first EL layer 144A1 includes a stack of an EL layer doped with a red phosphor dopant and an EL layer doped with a yellow phosphor dopant. The second EL layer 144A2 is an EL layer doped with a blue phosphor dopant. In the first EL layer 144A1, the EL layer doped with the red phosphor dopant may be formed above or below the EL layer doped with the yellow phosphor dopant.

In all of the aforementioned embodiments, light emitted from the first and second EL layers 144A1 and 144A2 are combined to form substantially white light in the area where the first and second EL layers 144A1 and 144A2 overlap each other. That is, the light emitted from the part of the OLED element relative to the first and second pixels R and G is the white light. The second EL layer emits substantially blue light at another part of the white OLED element 140A, where only the second EL layer 144A2 is formed. That is, the light emitted from the part of the OLED element 140A relative to the third pixel area B is the blue light.

To put it in other words, the first EL layer 144A1 is formed on the first anode 141A1 and the second anode 141A2. The second EL layer 144A2 is formed on the first anode 141A1, the second anode 141A2, and the third anode 141A3. The first EL layer 144A1 is formed on the second EL layer 144A2. That is, the second EL layer 144A2 is formed on a surface of the first anode 141A1, a surface of the second anode 141A2, and a surface of the third anode 141A3, and the first EL layer 144A1 is formed on over the second EL layer 144A2 that corresponds to the first anode 141A1 and the second anode 141A2.

The cathode 145A is disposed in both the first and second areas of the OLED element 140A, and disposed on the first EL layer 144A1 and the second EL layer 144A2. More particularly, the cathode 145A is formed on the first EL layer 144A1 in the first pixel R and the second pixel G, and on the second EL layer 144A2 in the third pixel B.

Accordingly, the multi-layered emission layer structure 144A emits white light in area relative to the first pixel R (e.g., red sub pixel region) and the second pixel G (e.g., green sub pixel region) where both the first and second EL layers 144A1 and 144A2 are formed. In the third pixel region B (e.g., blue sub pixel region), however, the first EL layer 144A1 is not disposed, and the second EL layer 144A2 emits blue light in the third pixel B without being combined with the light from the first EL layer 144A1.

As shown in FIG. 1A, a red color filter element and green color filter element is disposed in the respective pixels to filter the white light from the multi-layered emission layer structure to generate substantially red light and green light, and to transmit the filtered light at the corresponding pixels. In the white OLED element of the present disclosure, there is no blue color filter element for filtering the white light for generating blue light. Instead, the blue light is emitted from the second EL layer 144A2 disposed in the third pixel B. Since the blue light transmitted at the third pixel B is not the light generated by filtering the white light, the luminance of the blue light at the third pixel B is significantly improved without having to increase the driving current density at the blue pixel of the display device. Also, the same level of blue luminance as the blue luminance from conventional white OLED element can be obtained at lower current density, and thus the power consumption of the OLED element 140A can be decreased. Of course, the lower driving current density also leads to increase in the lifespan of the OLED element 140A.

Figure 1B:
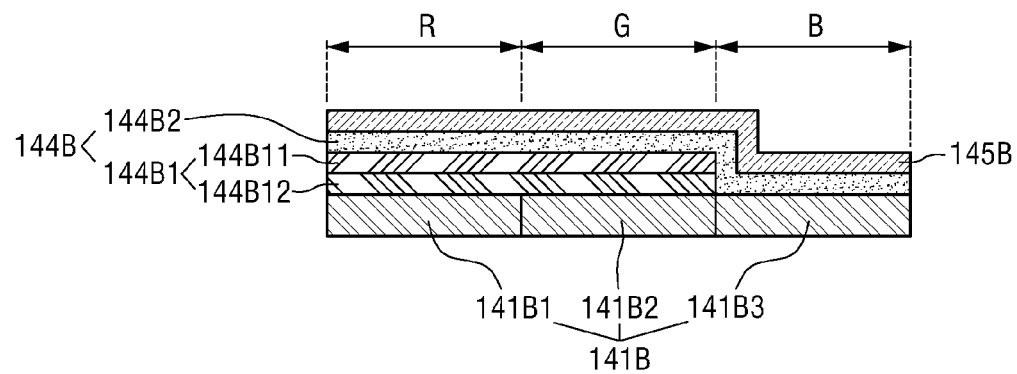

FIG. 1B is a pictorial representation (through a cross sectional view) depicting an OLED element 140B that can be employed in one embodiment of the present application. Referring to FIG. 1B, the first EL layer 144B1 is formed on the first anode 141B1 and the second anode 141B2. In some embodiments, the first EL layer 144B1 includes a stack of a red EL layer 144B11 and a green EL layer 144B12. The second EL layer 144B2, which emits blue light, is formed on the first anode 141B1, the second anode 141B2 and the third anode 141B3. That is, the first organic EL layer 144B1 is formed on a surface of the first anode 141B1 and a surface of the second anode 141B2, and the second EL layer 144B2 is formed on the first EL layer 144B1 and a surface of the third anode 141B3.

To simply put, the order in which the EL layers are disposed in the white OLED element 140B is different from order of the EL layers in the white OLED element 140A depicted in FIG. 1A. Despite being disposed in a different order, the first EL layer 144B1 and the second EL layer 144B2 of the OLED element 140B are arranged to be overlap each other on the first anode 141B1 and the second anode 141B2. Accordingly, the white light is emitted in the part of the multi-layered emission layer structure 140B relative to the first pixel R and the second pixel G. Further, the EL layer emitting blue light (i.e., second EL layer 144B2) of the OLED element 140B is extended further out to the part of the multi-layered emission layer structure 144B relative to the third pixel B. The blue light from the second EL layer 144B2 is substantially unaffected by the light emitted from the other EL layer(s) (e.g., the first emission layer 144B1) of the multi-layered emission layer structure 144B, and be transmitted at the third pixel B (e.g., blue sub pixel region). As such, the luminance and the improved lifespan of the display device can be achieved in a more efficient way.

Figure 1C:
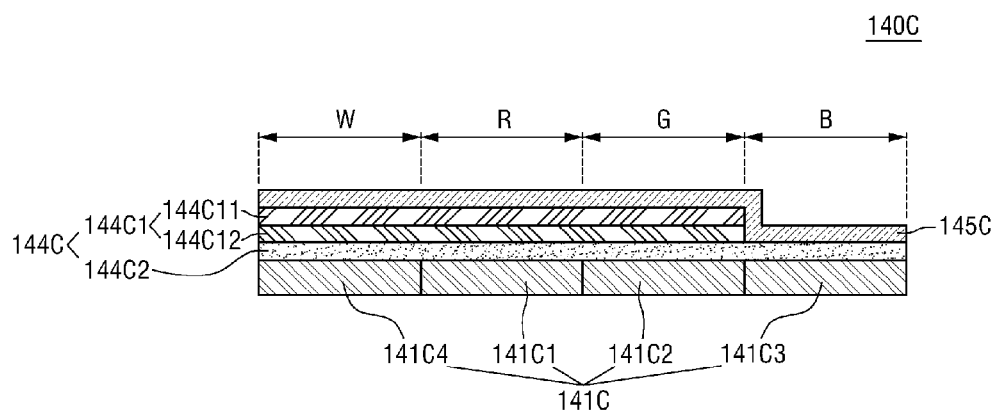

FIG. 1C is a pictorial representation (through a cross sectional view) depicting an OLED element 140C that can be employed in one embodiment of the display device. Referring to FIG. 1C, the OLED element 140C includes four pixels, including a first pixel R, a second pixel G, a third pixel B and a fourth pixel W. The first pixel R can be a red sub pixel region, the second pixel G can be a green sub pixel region, the third pixel B can be a blue sub pixel region, and the fourth pixel W can be a white sub pixel region. The white pixel can be used to further reduce the power consumption and improve the luminance of the OLED element.

An anode 141C is disposed in each of the sub pixel region. For instance, a first anode 141C1, a second anode 141C2, a third anode 141C3 and a fourth anode 141C4 are disposed in the first pixel R, the second pixel G, the third pixel B and the fourth pixel W, respectively. Although the first anode 141C1, the second anode 141C2, the third anode 141C3, and the fourth anode 141C4 are illustrated to be in contact with adjacent anode, it should be appreciated that each anode is configured to operate separately with discrete signal supplied to each of the anodes in the pixel regions.

A cathode 145C is formed on the anode 141C. The cathode 145C is formed on the entire multi-layered emission layer structure 144C. The cathode 145C is connected to an additional voltage wire to supply a common voltage to all sub pixel regions. Also, the cathode 145C can be patterned so long as the cathode 145C is configured to supply a common voltage to all four sub pixel regions.

In this example, the first EL layer 144C1 is formed on the first anode 141C1, the second anode 141C2, and the fourth anode 141C4. The second EL layer 144C2 is formed on the first anode 141C1, the second anode 141C2, the third anode 141C3, and the fourth anode 141C4. Accordingly, the first EL layer 144C1 is formed in the first pixel R (red sub pixel region), the second pixel G (green sub pixel region), and the fourth pixel W (white sub pixel region), whereas the second EL layer 144C2 is formed in the first pixel R (red sub pixel region), the second pixel G (green sub pixel region), the third pixel B (blue sub pixel region), and the fourth pixel W (white sub pixel region). As described above, the multi-layered emission layer structure 144C emits white light in the pixels having both the first and second EL layers. Accordingly, white light is emitted from the first pixel R, the second pixel G, and the fourth pixel W. In contrast, blue light is emitted from the third pixel B, where only the second EL layer 144C2 is disposed. In some embodiments, the first EL layer 144C1 includes a stack of a red EL layer 144C11 and a green EL layer 144C12, and the second EL layer 144C2 is a blue EL layer.

As described, red and green color filter elements can be disposed in the first pixel R and the second pixel G, respectively. By filtering the white light from the multi-layered emission layer structure 144C, red colored light is transmitted at the red sub pixel region and green light is transmitted at the green sub pixel region. The blue light emitted from the second EL layer 144C2 is transmitted at the blue sub pixel region. In the white sub pixel region, the white light from the multi-layered emission structure 144C is transmitted.

In FIG. 1C, the first EL layer 144C1 is illustrated to be disposed on the second EL layer 144C2 to form the multi-layered light emitting layer structure 140C. In some embodiments, however, the second EL layer 144C2 may be disposed on the first EL layer 144C1. In such cases, the second EL layer 144C2 (e.g., the EL layer for emitting blue light) should be disposed the part of the multi-layered emission layer structure relative to all four pixels described above, and the first EL layer 144C1 should be disposed in the part of the multi-layered emission layer structure relative to the pixels except the blue pixel.

Figure 2A:
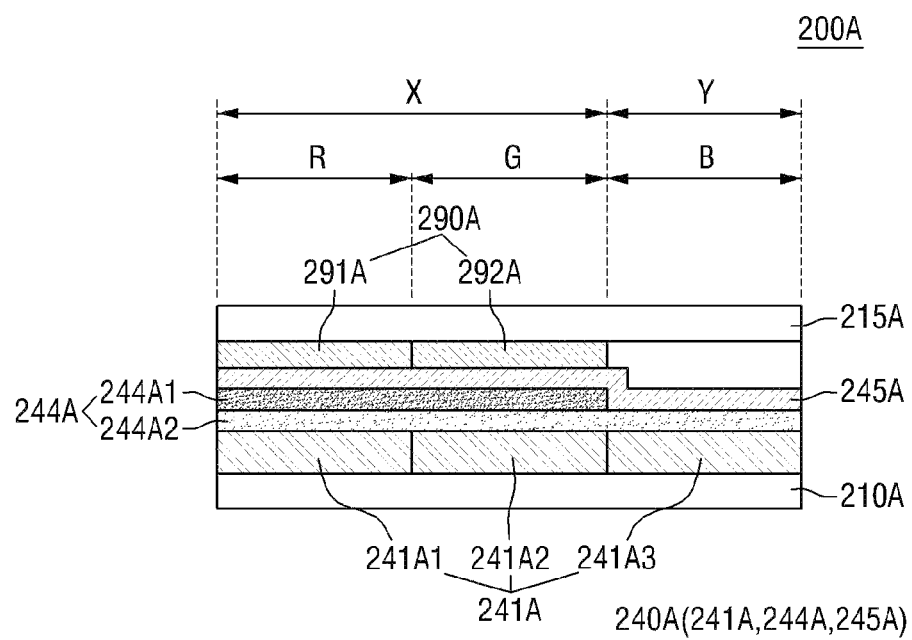
FIGS. 2A to 2E, each illustrates a cross-sectional view of an exemplary white OLED element according to an embodiment of the present invention.

FIG. 2A is a pictorial representation (through a cross sectional view) depicting an organic light emitting display device 200A according to an exemplary embodiment of the present invention. Referring to FIG. 2A, the organic light emitting display device 200A includes a first substrate 210A, an white OLED element 240A, a plurality of color filter elements 290A, and a second substrate 215A. The white OLED element 240A includes a plurality of anodes 241A, a multi-layered emission layer structure 244A and a cathode 245A that are substantially the same as the OLED element 140A described above.

The first substrate 210A is a substrate configured to support various elements of the organic light emitting display device 200A. The first substrate 210A is a support substrate disposed at a bottom of the organic light emitting display device 200A, and may be also referred to as a substrate, a support member, a support substrate, a lower substrate, a thin film transistor (TFT) substrate, a lower support member, etc. The support member may be formed of an insulating material, e.g., glass or plastic, but is not limited thereto and may be formed of any of various other materials.

A material of the first substrate 210A may depend on a light-emitting manner of the organic light emitting display device 200A. For example, when the organic light emitting display device 200A is a top emission type organic light emitting display device, the first substrate 210A may be formed of an insulating material but does not always need to be formed of a transparent material. When the organic light emitting display device 200A is a bottom emission type organic light emitting display device, the first substrate 210A may be formed of a transparent insulating material.

When the organic light emitting display device 200A is a flexible organic light emitting display device, the first substrate 210A may be formed of a flexible insulating material. Here, flexible insulating materials available may include polyimide (PI), polyetherimide (PEI), polyethylene terephthalate (PET), polycarbonate (PC), polymethyl methacrylate (PMMA), polystyrene (PS), styrene acrylonitrile (SAN) polymer, silicon-acryl resin, etc. When the organic light emitting display device 200A is a transparent organic light emitting display device, the first substrate 210A may be formed of a transparent insulating material.

The organic light emitting display device 200A may include a plurality of unit pixels. When the first substrate 210A includes a plurality of unit pixels, the plurality of unit pixels may be arranged in a matrix. Each of the plurality of unit pixels may include a plurality of sub pixel regions. The plurality of sub pixel regions may include a first sub pixel region R, a second sub pixel region G, and a third sub pixel region B. Here, the first sub pixel region R, the second sub pixel region G, and the third sub pixel region B are sub pixel regions that emit different colors. The first sub pixel region R may be a red sub pixel region, the second sub pixel region G may be a green sub pixel region, and the third sub pixel region B may be a blue sub pixel region. In the present disclosure, the red sub pixel region, the green sub pixel region, and the blue sub pixel region are illustrated as the first sub pixel region R, the second sub pixel region G, and the third sub pixel region B, respectively. In the present disclosure, the sub pixel region may also be referred to as a pixel, and the sub pixel region may also be referred to as a sub pixel.

As shown in FIG. 2A, the organic light emitting display device 200A includes a first area X and a second area Y. The second area Y includes the third sub pixel region B, which is a blue sub pixel region. The first area X includes the first sub pixel region R and the second sub pixel region G, which are remaining sub pixel regions excluding the blue sub pixel region.

The plurality of anodes 241A includes a first anode 241A1, a second anode 241A2, and a third anode 241A3. The first anode 241A1 is disposed on a region corresponding to the first sub pixel region R, the second anode 241A2 is disposed on a region corresponding to the second sub pixel region G, and the third anode 241A3 is disposed on a region corresponding to the third sub pixel region B. Although the first, second and third anodes are illustrated as being in contact with one another, each of the anode is individually addressable such that signals can be provided on individual basis to drive the first, second and third anodes 214A1, 214A2 and 242A3 in the sub pixel regions.

The multi-layered emission layer structure 244A that includes the first EL layer 244A1 and the second EL layer 244A2 are formed on the anode 241A. In the multi-layered emission layer structure 244A, the first EL layer 244A1 is formed in the first area X of the first substrate 210A and the second EL layer 244A2 is formed in the first area X and the second area Y of the first substrate 210A. Here, the first area X includes the first sub pixel region R and the second sub pixel region G, and the second area Y includes the third sub pixel region B. Thus, in the multi-layered emission layer structure 244A, the second EL layer 244A2 is formed on the first anode 241A1 corresponding to the first sub pixel region R, the second anode 241A2 corresponding to the second sub pixel region G, and the third anode 241A3 corresponding to the third sub pixel region B, and the first EL layer 244A1 is formed on the first anode 241A1 corresponding to the first sub pixel region R and the second anode 241A2 corresponding to the second sub pixel region G. The first EL layer 244A1 is formed on the second EL layer 244A2. That is, the second EL layer 244A2 is formed on a surface of the first anode 241A1, a surface of the second anode 241A2, and a surface of the third anode 241A3, and the first EL layer 244A1 is formed on a surface of the second EL layer 244A2 corresponding to the first anode 241A1 and the second anode 241A2.

Light emitted from the first EL layer 244A1 and light emitted from the second EL layer 244A2 are different, and are combined to form white light. Specifically, the second EL layer structure 244A2 may be a blue EL layer that emits blue light, and the first EL layer structure 244A1 may be an EL layer that emits light of another colored light that, in combination with the blue light, form the white light.

In some embodiments, the first EL layer 244A1 may be an EL layer in which a host is doped with a red dopant and a green dopant, and the second EL layer 244A2 may be a blue EL layer. Lights emitted from the first and second EL layers 244A1 and 244A2 are mixed to transmit white colored light in the area where the first and second EL layers 244A1 and 244A2 overlap one another. The second EL layer emits blue colored light at another area where only the second EL layer 144A2 is formed.

In some embodiments, the first EL layer 244A1 includes a stack of a yellow EL layer and a green EL layer, and the second EL layer 244A2 is a blue EL layer. The yellow EL layer of the first EL layer 244A1 may be disposed above or below the green EL layer of the first EL layer 244A1. Also, in some embodiments, the first EL layer 244A1 includes a stack of a red EL layer and a green EL layer, and the second EL layer 244A2 is a blue EL layer. Within the first EL layer 244A1, the red EL layer may be formed above or below the green EL layer. In some embodiments, the first EL layer 244A1 includes a stack of an EL layer doped with a red phosphor dopant and an EL layer doped with a yellow phosphor dopant. The second EL layer 244A2 is an EL layer doped with a blue phosphor dopant. In the first EL layer 244A1, the EL layer doped with the red phosphor dopant may be formed above or below the EL layer doped with the yellow phosphor dopant.

In all of the aforementioned embodiments, light emitted from the first and second EL layers 244A1 and 244A2 are combined to form the white light in the area where the first and second EL layers 244A1, 244A2 overlap each other. The second EL layer emits blue colored light at another area where only the second EL layer 244A2 is formed.

The cathode 245A is formed on the first EL layer 244A1 in the first area X, and is formed on the second EL layer 244A2 in the second area Y. That is, the cathode 245A is formed on the first EL layer 244A1 in the first sub pixel region R and the second sub pixel region G, and is formed on the second EL layer 244A2 in the third sub pixel region B.

The cathode 245A is configured to supply electrons and is thus formed of a material having high electrical conductivity and a low work function, i.e., a material of a cathode. Specifically, a material of the cathode 245A may vary depending on the light-emitting mode of the organic light emitting display device 200A. When the organic light emitting display device 200A is a top emission type organic light emitting display device as illustrated in FIG. 2A, the cathode 245A may be formed of a material having a low work function to discharge light emitted from the multi-layered emission layer structure 244A to the top of the organic light emitting display device 200A.

The second substrate 215A is a substrate configured to support and to protect various elements of the organic light emitting display device 200A, and is disposed opposite the first substrate 210A. The second substrate 215A is a support substrate disposed on the top of the organic light emitting display device 200A and may be referred to as an upper substrate, a protective substrate, a color filter substrate, a cover substrate, an upper support member, etc.

The second substrate 215A may be formed of an insulating material such as glass or plastic, but is not limited thereto and may be formed of any of various other materials. When the organic light emitting display device 200A is a top emission type organic light emitting display device as illustrated in FIG. 2A, the second substrate 215A may be formed of a transparent insulating material. In some embodiments, the second substrate 215A may be formed of a material that is substantially the same as the material of the first substrate 210A.

Although note shown in FIG. 2A, a black matrix may be formed on the second substrate 215A. The black matrix may be formed at a boundary between sub pixel regions. The black matrix may be formed of chromium (Cr) or another non-transparent metal film, or may be formed of resin. The black matrix may separate the sub pixel regions and the color filter 290A formed on the sub pixel regions.

A plurality of color filter elements 290A is arranged relative to the first area X. More specifically, the red color filter element 291A formed in the red sub pixel region R within the first area X, and a green color filter element 292A formed in the green sub pixel region G within the first area X. These color filter elements are positioned such that the white colored light generated from the multi-layered emission layer structure 244A is passed through and transformed into red colored light at the red sub pixel area R and green colored lights at the green sub pixel area G.

Color filter element needs not be arranged relative to the second area Y. Since the part of the multi-layered emission layer structure 244A arranged at the second area Y (i.e., the third sub pixel region B) is the second EL layer 244A2 (i.e., a blue EL layer), blue colored light can be transmitted at the third sub pixel region B (i.e., blue sub pixel region B) without any color filter element. To planarize the sub pixel areas, however, a transparent member (e.g., transparent resin layer) having the same thickness as the plurality of color filter elements 290A may be disposed at the second area Y. In this configuration, improvement in the efficiency, power consumption and the lifespan of the organic light emitting element 240A can be obtained.

The organic light emitting display device 200A in FIG. 2A has been illustrated as a top emission type organic light emitting display device and the plurality of color filter elements 290A has been shown as being formed on the cathode 245A.

Although for convenience of explanation, FIG. 2A illustrates that the color filter elements 290A and the cathode 245A contact each other, the cathode 245A and the color filter elements 290A may be disposed spaced from each other and an encapsulating unit may be disposed in a space between the cathode 245A and the color filter elements 290A. The encapsulating unit will be described in detail below.

Figure 2B:
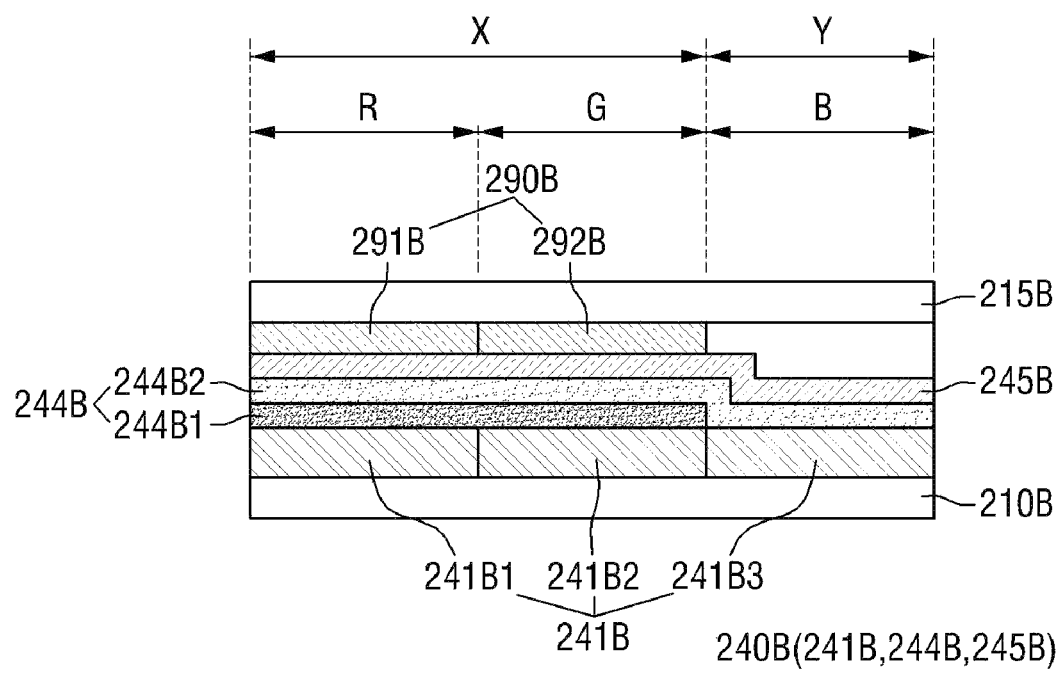

FIG. 2B is a pictorial representation (through a cross sectional view) depicting an organic light emitting display device 200B according to an exemplary embodiment of the present invention. Referring to FIG. 2B, except for the multi-layered emission layer structure 240A, all of the components are same as the organic light emitting display device 200A. In the organic light emitting display device 200A, the second EL layer 244B2 is formed on the first EL layer 244B1. In other words, the first EL layer 244B1 is formed on a surface of the first anode 241B1 and a surface of the second anode 241B2, and the second EL layer 244B2 is formed on a surface of the first EL layer 244B1 and a surface of the third anode 241B3.

Figure 2C:
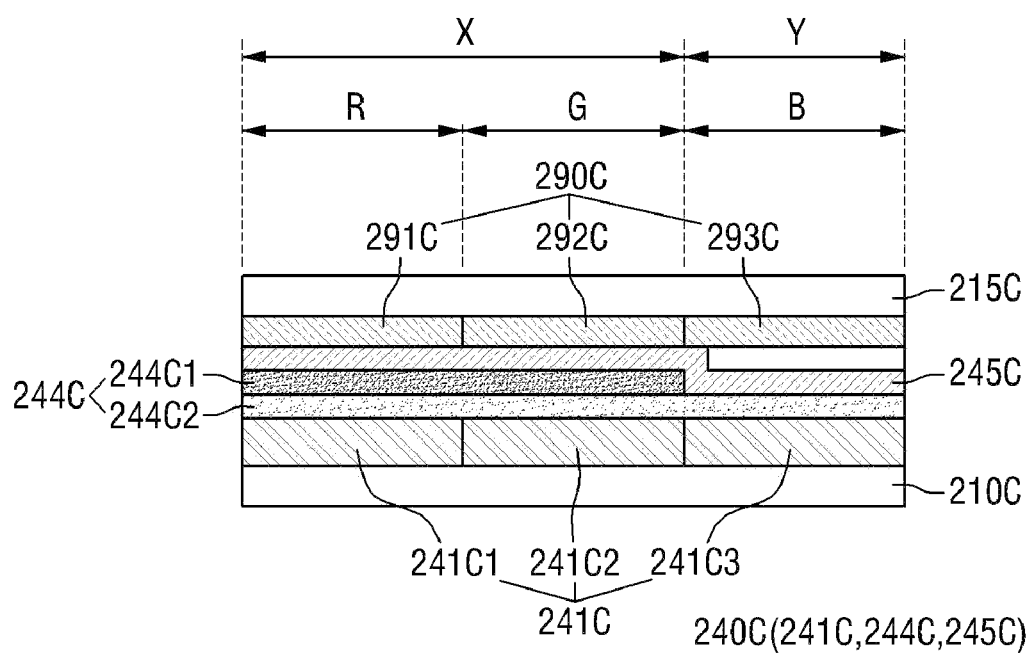

FIG. 2C is a pictorial representation (through a cross sectional view) depicting an organic light emitting display device 200C according to an exemplary embodiment of the present invention. Elements illustrated in FIG. 2C are substantially the same as those in FIG. 2A with like numerals assigned thereto (except for alphabets).

In this example, the plurality of color filter elements 290C further includes a third color filter element 293C. The third color filter element 293C is disposed in the second area Y. Specifically, the third color filter element 293C is a blue color filter element formed in a third sub pixel region B, which is a blue sub pixel region.

Since only the second EL layer 244C2 is formed in the second area Y, which includes the third sub pixel area B, blue light emitted from second EL layer 244C is transmitted at the third sub pixel region B. Thus, there is no need for the blue color filter element 293C to represent blue color in the third sub pixel region B. When white light emitted from a white EL layer passes through the blue color filter element, only the light in certain wavelength range is passed through, thereby substantially decreasing the luminance. When the blue light emitted from the second EL layer 244C2 passes through the blue color filter element 293C, however, large part of the blue light can be passed through the color filter element 293C without being absorbed by the color filter element 293C. As such, even if the third color filter 293C is disposed in the third sub pixel region B, the luminance efficiency is hardly reduced. Furthermore, blue color coordinates are easier to match and a contrast ratio (CR) may be improved in the blue sub pixel region B by filtering the blue light through the blue color filter.

Figure 2D:
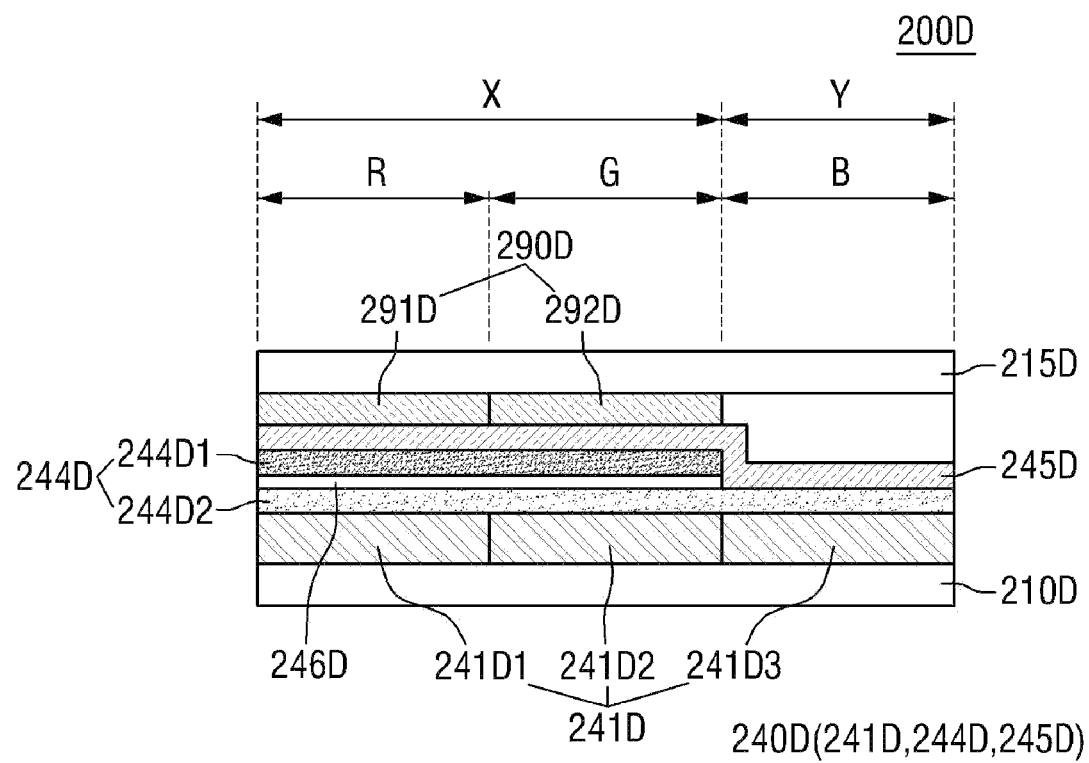

FIG. 2D is a pictorial representation (through a cross sectional view) depicting an organic light emitting display device 200D according to an exemplary embodiment of the present invention. Elements illustrated in FIG. 2D are substantially the same as those in FIG. 2A with like numerals assigned thereto (except for alphabets). Referring to FIG. 2D, a charge generation layer (CGL) 246D is formed between a first EL layer 244D1 and a second EL layer 244D2. The charge generation layer 246D is a layer configured to generate electric charges (i.e., electrons and holes) therein. The charge generation layer 246D is present in a structure that connects the first EL layer 244D1 and the second EL layer 244D2 in series, and increases the efficiency of current generated between the first EL layer 244D1 and the second EL layer 244D2.

As shown in FIG. 2D, the charge generation layer 246D is formed between the first EL layer 244D1 and the second EL layer 244D2 in a first area X. Since the charge generation layer 246D is formed between the first EL layer 244D1 and the second EL layer 244D2 to increase the efficiency of current generated between the first EL layer 244D1 and the second EL layer 244D2, the charge generation layer 246D is formed in the first area X including the first sub pixel region R and the second sub pixel region G where both the first EL layer 244D1 and the second EL layer 244D2 are formed. However, the present invention is not limited thereto, and the charge generation layer 246D may be formed in both the first area X and a second area Y, especially when the first and/or the second EL layer itself is formed of multiple EL layers.

Figure 2E:
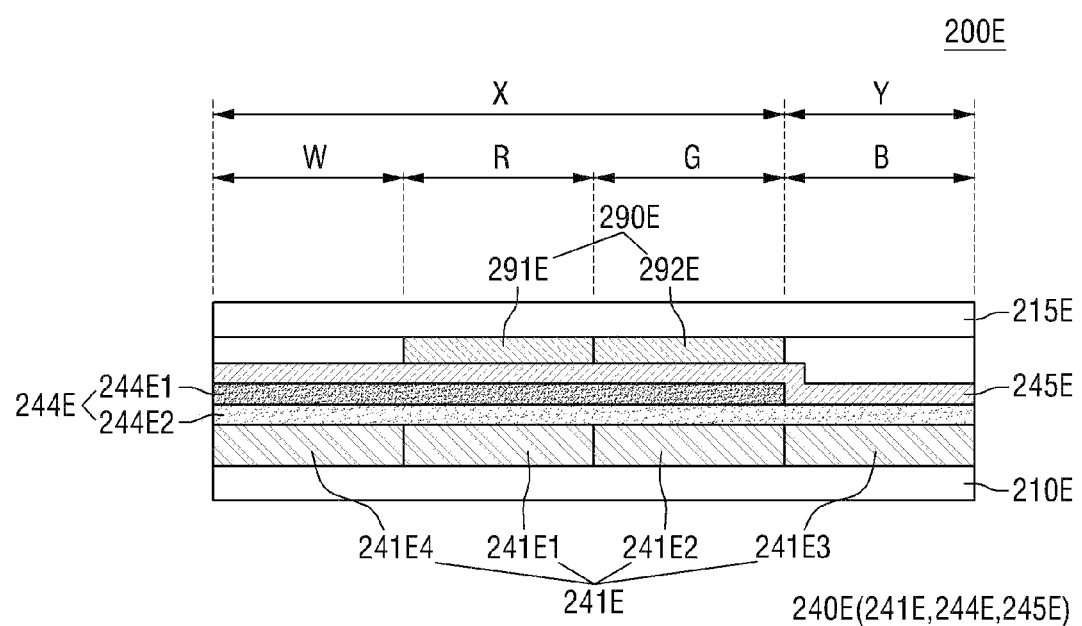

FIG. 2E is a pictorial representation (through a cross sectional view) depicting an organic light emitting display device 200E according to an exemplary embodiment of the present invention. Elements illustrated in FIG. 2E are substantially the same as those in FIG. 2A with like numerals assigned thereto (except for alphabets).

Referring to FIG. 2E, the organic light emitting display device 200E may include pixel regions, and each of the pixel regions may include a plurality of sub pixel regions. For example, each of the plurality of pixel regions may include a first sub pixel region R, a second sub pixel region G, a third sub pixel region B, and a fourth sub pixel region W. Here, it is defined that the first sub pixel region R is a red sub pixel region, the second sub pixel region G is a green sub pixel region, the third sub pixel region B is a blue sub pixel region, and the fourth sub pixel region W is a white sub pixel region configured to reduce power consumption and improves brightness. Also, it is defined that a second area Y of the first substrate 210E is the third sub pixel region B which is the blue sub pixel region, and a first area X of the first substrate 210E includes the first sub pixel region R, the second sub pixel region G, and the fourth sub pixel region W which are the other sub pixel regions except for the blue sub pixel region.

An anode 241E includes a first anode 241E1, a second anode 241E2, a third anode 241E3, and a fourth anode 241E4. It is defined that the first anode 241E1 is formed on a region corresponding to the first sub pixel region R, the second anode 241E2 is formed on a region corresponding to the second sub pixel region G, the third anode 241E3 is formed on a region corresponding to the third sub pixel region B, and the fourth anode 241E4 is formed on a region corresponding to the fourth sub pixel region W. Although for convenience of explanation, FIG. 2E illustrates that the first anode 241E1, the second anode 241E2, the third anode 241E3, and the fourth anode 241E4 contact one another, the first anode 241E1, the second anode 241E2, the third anode 241E3, and the fourth anode 241E4 may be formed to be separated from one another so that signals may be independently supplied to the sub pixel regions to independently drive these anodes in units of the sub pixel regions.

A cathode 245E is formed on the anode 241E. The cathode 245E may be formed on the entire anode 241E. That is, since the cathode 245E is connected to an additional voltage wire to supply the same voltage to all the sub pixel regions, the cathode 245E may not be patterned in units of the sub pixel regions and may be formed to cover the entire anode 241E.

A first EL layer 244E1 is formed on the first anode 241E1, the second anode 241E2, and the fourth anode 241E4, and a second EL layer 244E2 is formed on the first anode 241E1, the second anode 241E2, the third anode 241E3, and the fourth anode 241E4. That is, the first EL layer 244E1 is formed on the red sub pixel region, the green sub pixel region, and the white sub pixel region, whereas the second EL layer 244E2 is formed on the red sub pixel region, the green sub pixel region, the blue sub pixel region, and the white sub pixel region. Thus, the multi-layered emission layer structure 244E emits white light in the red sub pixel region R, the green sub pixel region G, and the white sub pixel region W in which both the first and second EL layers 244E1 and 244E2 are formed. The multi-layered emission layer structure 244E emits blue light in the blue sub pixel region B in which only the second EL layer 244E2 is disposed.

The first EL layer 244E1 is formed on the first anode 241E1, the second anode 241E2, and the fourth anode 241E4. The second EL layer 244E2 is formed on the first anode 241E1, the second anode 241E2, the third anode 241E3, and the fourth anode 241E4. The first EL layer 244E1 is formed on the second EL layer 244E2. That is, the second EL layer 244E2 is formed on a surface of the first anode 241E1, a surface of the second anode 241E2, a surface of the third anode 241E3, and a surface of the fourth anode 241E4, and the first EL layer 244E1 is formed on a surface of the second EL layer 244E2 corresponding to the first anode 241E1, the second anode 241E2, and the fourth anode 241E4. A process of forming the first and second EL layers 244E1 and 244E2 according to a manner of stacking the first and second EL layers 244E1 and 244E2 will be described below. In some embodiments, as illustrated in FIG. 2B, the first EL layer 244E1 may be formed on the surface of the first anode 241E1, a surface of the second anode 241E2, and a surface of the fourth anode 241E4, and the second EL layer 244E2 may be formed on a surface of the first EL layer 244E1 and a surface of the third anode 241E3.

The cathode 245E is formed on the first EL layer 244E1 and the second EL layer 244E2. Specifically, the cathode 245E is formed on the first EL layer 244E1 in the first sub pixel region R, the second sub pixel region G, and the fourth sub pixel region W, and on the second EL layer 244E2 in the third sub pixel region B.

Figure 3A:
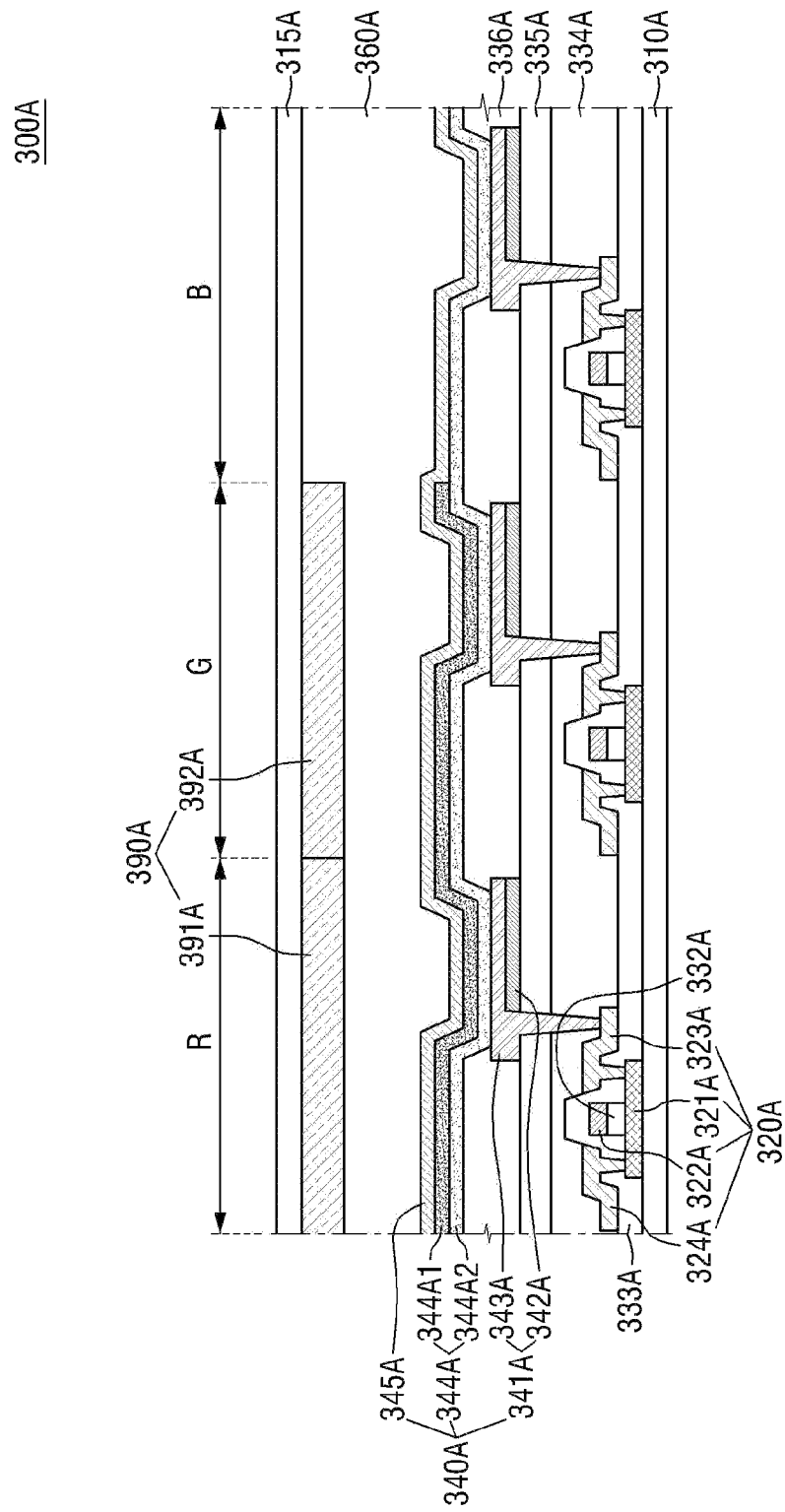
FIGS. 3A to 3F, each illustrates a cross-sectional view of an exemplary display device according to an embodiment of the present invention.

FIG. 3A is a pictorial representation (through a cross sectional view) depicting an organic light emitting display device 300A according to an exemplary embodiment of the present invention.

Referring to FIG. 3A, the organic light emitting display device 300A includes a first substrate 310A, a thin film transistor 320A, an organic light emitting element 340A, an encapsulating unit 360A, a color filter 390A, and a second substrate 315A. The first substrate 310A, the color filter 390A, and the second substrate 315A are substantially the same as the first substrate 210A, the color filter 290A, and the second substrate 215A of FIG. 2A, and are not redundantly described here.

An active layer 321A is formed on the first substrate 310A. The active layer 321A may include a channel region in which a channel is formed, and a source region and a drain region that contact a source electrode 323A and a drain electrode 324A, respectively. The active layer 321A may be formed of amorphous silicon, polycrystalline silicon, or an oxide semiconductor. In the case of a thin film transistor using polycrystalline silicon as an active layer, an ion injection process is performed to adjust a resistance of the active layer and an additional mask may be used to define an ion injection region. Since the ion injection process is added, the thin film transistor using polycrystalline silicon as an active layer is disadvantageous in terms of a manufacturing process. In contrast, a thin film transistor using an oxide semiconductor as an active layer has higher mobility than a thin film transistor using amorphous silicon as an active layer, has a much lower amount of leak current than the thin film transistor using amorphous silicon as an active layer and a thin film transistor using polycrystalline silicon as an active layer, and satisfies high reliability test conditions. Also, the thin film transistor using an oxide semiconductor as an active layer has a regular distribution of threshold voltages, compared to the thin film transistor using polycrystalline silicon as an active layer.

The active layer 321A may include an oxide semiconductor. As a material of the oxide semiconductor included in the active layer 321A, an indium-tin-gallium-zinc oxide (InSnGaZnO)-based material which is a quaternary metal oxide; an indium-gallium-zinc oxide (InGaZnO)-based material, an indium-tin-zinc oxide (InSnZnO)-based material, an indium-aluminum-zinc oxide (InAlZnO)-based material, a tin-gallium-zinc oxide (SnGaZnO)-based material, an aluminum-gallium-zinc oxide (AlGaZnO)-based material, or a tin-aluminum-zinc oxide (SnAlZnO)-based material which is a ternary metal oxide; an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, or an indium gallium oxide (InGaO)-based material which is a binary metal oxides; an indium oxide (InO)-based material, a tin oxide (SnO)-based material, a zinc oxide (ZnO)-based material, etc. may be used. The composition ratio of the elements included in each of the oxide semiconductors described above is not limited and may be variously adjusted.

In some embodiments, a buffer layer may be formed on the entire first substrate 310A. The buffer layer may prevent inflow of moisture or impurities via the first substrate 310A, and provide a flat surface on the first substrate 310A. However, the buffer layer is optional and may be selectively formed according to the type of the first substrate 310A or the type of the thin film transistor 320A used in the organic light emitting display device 300A. For example, the buffer layer is optional when the thin film transistor 320A uses an oxide semiconductor as the active layer 321A but may be indispensable to improving interface characteristics of the active layer 321A when the thin film transistor 320A uses amorphous silicon or polycrystalline silicon as the active layer 321A. If the buffer layer is used, the buffer layer may be formed of a silicon oxide film, a silicon nitride film, or a multi-layer film thereof.

A gate insulating film 332A is formed on the active layer 321A. The gate insulating film 332A insulates the active layer 321A and a gate electrode 322A from each other. The gate insulating film 332A may be formed of a silicon oxide film, a silicon nitride film, or a multi-layer film thereof, but is not limited thereto and may be formed of any of other various materials. The gate insulating film 332A may be formed on the entire first substrate 310A including the active layer 321A but may be formed only on the active layer 321A as illustrated in FIG. 3A since it is sufficient for the gate insulating film 332A to insulate the active layer 321A and the gate electrode 322A from each other. When the gate insulating film 332A is formed on the entire first substrate 310A, the gate insulating film 332A may be formed to have contact holes via which some regions of the active layer 321A is exposed. Some regions of the source region and the drain region of the active layer 321A may be exposed via the contact holes.

The gate electrode 322A is formed on the gate insulating film 332A. At least a portion of the gate electrode 322A overlaps with the active layer 321A, and particularly, the channel region of the active layer 321A. The gate electrode 322A may be formed of at least one selected from the group consisting of molybdenum (Mo), aluminum (Al), chromium (Cr), gold (Au), titanium (Ti), nickel (Ni), neodymium (Nd), and copper (Cu), but is not limited thereto and may be formed of any of other various materials. Also, the gate electrode 322A may be a multilayer film including at least one selected from the group consisting of molybdenum (Mo), aluminum (Al), chromium (Cr), gold (Au), titanium (Ti), nickel (Ni), neodymium (Nd), and copper (Cu).

An interlayer insulating film 333A is formed on the gate electrode 322A. The interlayer insulating film 333A may be formed of a material used to form the gate insulating film 332A and formed of a silicon oxide film, a silicon nitride film, or a multilayer film including these films, but is not limited thereto and may be formed of any of other various materials. The interlayer insulating film 333A may be formed on the entire first substrate 310A, and may have contact holes via which some regions of the active layer 321A are exposed. Some regions of the source and drain regions of the active layer 321A may be exposed via the contact holes.

The source electrode 323A and the drain electrode 324A are formed on the interlayer insulating film 333A. The source electrode 323A and the drain electrode 324A may be electrically connected to the source and drain regions of the active layer 321A via the contact holes formed in the interlayer insulating film 333A and/or the gate insulating film 332A, respectively. The source electrode 323A and the drain electrode 324A may be each formed of at least one selected from the group consisting of molybdenum (Mo), aluminum (Al), chromium (Cr), gold (Au), titanium (Ti), nickel (Ni), neodymium (Nd), and copper (Cu), but is not limited thereto and may be formed of any of other various materials. Also, the source electrode 323A and the drain electrode 324A may be each a multilayer film including at least one selected from the group consisting of molybdenum (Mo), aluminum (Al), chromium (Cr), gold (Au), titanium (Ti), nickel (Ni), neodymium (Nd), and copper (Cu).

A passivation film 334A is formed on the source electrode 323A and the drain electrode 324A. The passivation film 334A may have a contact hole via which the source electrode 323A or the drain electrode 324A is exposed. The passivation film 334A is a protective layer, may be formed of the material used to form the interlayer insulating film 333A and/or the gate insulating film 332A, and may be formed to be a single or multiple layer including one of a silicon oxide film, a silicon nitride film, etc., but is not limited thereto and may be formed of any of other various materials. Although FIG. 3A illustrates that the organic light emitting display device 300A includes the passivation film 334A, the passivation film 334A is not an indispensable element and is thus optional.

An over-coating layer 335A is formed on the source electrode 323A and the drain electrode 324A. The over-coating layer 335A may be also referred to as a planarizing film. When the passivation film 334A is formed, the over-coating layer 335A may be formed on the passivation film 334A. The over-coating layer 335A provides a flat surface on the first substrate 310A. Also, the over-coating layer 335A may have a contact hole via which the source electrode 323A or the drain electrode 324A is exposed. The over-coating layer 335A may be formed of at least one material among polyacrylates resin, epoxy resin, phenolic resin, polyamides resin, polyimides resin, unsaturated polyesters resin, poly-phenylenethers resin, poly-phenylenesulfides resin, and benzocyclobutene, but is not limited thereto and may be formed of any of various other materials.

The thin film transistor 320A includes the active layer 321A, the gate electrode 322A, the source electrode 323A, and the drain electrode 324A formed as described above. The thin film transistor 320A may be formed on the first substrate 310A in units of pixel regions or sub pixel regions, and enable the pixel regions or the sub pixel regions to be independently driven. The structure of the thin film transistor 320A is, however, not limited to the above description and may be modified to any of well-known various thin film transistor structures that those of ordinary skill would easily achieved.

The thin film transistor 320A may be formed on the first substrate 310A to cause a multi-layered emission layer structure 344A to emit light. In general, a switching thin film transistor and a driving thin film transistor are used to cause the multi-layered emission layer structure 344A to emit light based on image information of a data signal input according to a scan signal.

When the scan signal is supplied to the switching thin film transistor via a gate wire, the switching thin film transistor transmits the data signal received via a data wire to a gate electrode of the driving thin film transistor. The driving thin film transistor delivers current supplied via a power supply wire to an anode, based on the data signal received from the switching thin film transistor, and light emission of an EL layer of a corresponding pixel or sub pixel is controlled using the current supplied to the anode.

The organic light emitting display device 300A may further include a thin film transistor for a compensation circuit designed to prevent abnormal driving of the organic light emitting display device 300A. In the present disclosure, only the driving thin film transistor among various thin film transistors that may be included in the organic light emitting display device 300A is illustrated for convenience of explanation.

Thin film transistors may be classified into an inverted-staggered type thin film transistor and a coplanar type thin film transistor according to the location of elements thereof. The inverted-staggered type thin film transistor means a thin film transistor in which a gate electrode is disposed opposite a source electrode and a drain electrode with respect to an active layer. The coplanar type thin film transistor means a thin film transistor in which a gate electrode is disposed at the same side as a source electrode and a drain electrode with respect to an active layer. In the present disclosure, the coplanar type thin film transistor is illustrated for convenience of explanation, but the present invention is not limited thereto and the inverted-staggered type thin film transistor may be employed.

The organic light emitting element 340A including the anodes 341A, the multi-layered emission layer structure 344A, and a cathode 345A is formed on the first substrate 310A. The organic light emitting element 340A is driven to form an image according to the principle that holes supplied from the anodes 341A and electrons supplied from the cathode 345A are recombined in the EL layer(s) to emit light.

The organic light emitting display device 300A may be an independent driving display device, and is each of the sub pixel regions may be driven separately. Thus, the thin film transistor 320A and the organic light emitting element 340A described above may be disposed in the sub pixel regions to cause the thin film transistor 320A disposed in each of the sub pixel regions to independently drive the organic light emitting element 340A.

The anodes 341A are formed on the over-coating layer 335A. The anodes 341A may be connected to the source electrode 323A of the thin film transistor 320A via the contact hole formed in the over-coating layer 335A. In the present disclosure, it has been described that the anodes 341A are connected to the source electrode 323A on an assumption that the thin film transistor 320A is an N-type thin film transistor. However, when the thin film transistor 320A is a P-type thin film transistor, the anodes 341A may be connected to the drain electrode 324A. The anodes 341A may directly contact the multi-layered emission layer structure 344A or may contact the multi-layered emission layer structure 344A via a conductive material to be electrically connected to the EL layer 344A.

Since the anodes 341A should supply holes, the anodes 341A are formed of a material having a high work function. The anodes 341A may each include a transparent conductive layer 343A having a high work function. The transparent conductive layer 343A may be formed of a transparent conductive oxide (TCO), such as indium tin oxide (ITO), indium zinc oxide (IZO), indium tin zinc oxide (ITZO), zinc oxide (Zinc Oxide), or tin oxide (Tin Oxide).

When the organic light emitting display device 300A is a top emission type organic light emitting display device as illustrated in FIG. 3A, the anodes 341A each include a reflective layer 342A formed below the transparent conductive layer 343A. The multi-layered emission layer structure 344A emits light in a forward direction. However, when the organic light emitting display device 300A is a top emission type organic light emitting display device, light emitted from the multi-layered emission layer structure 344A should be discharged to the top of the organic light emitting display device 300A. However, as described above, when the anodes 341A each include only the transparent conductive layer 343A, light emitted from the multi-layered emission layer structure 344A toward the anodes 341A may be reflected upward by other elements disposed below the anodes 341A but may also be discharged below the first substrate 310A and thus be lost. In this case, the luminance efficiency of the organic light emitting display device 300A is low. Thus, each of the anodes 341A may further include an additional low-resistance reflective layer 342A to discharge light, which is emitted from the multi-layered emission layer structure 344A toward the anodes 341A, to the top of the organic light emitting display device 300A. The reflective layer 342A may be formed of a conductive layer having high reflectivity, e.g., silver (Ag), nickel (Ni), gold (Au), platinum (Pt), aluminum (Al), copper (Cu), or molybdenum/aluminum neodymium (Mo/AlNd). Although it has been defined in the present disclosure that the anodes 341A each include the transparent conductive layer 343A and the reflective layer 342A, it may be defined that the anodes 341A each include only the transparent conductive layer 343A and the reflective layer 342A is separately disposed. Also, it has been described in the present disclosure that the anodes 341A each include a transparent conductive material having a high work function and a reflective metal layer, but the anodes 341A may be formed of a conductive material having a high work function and high reflectivity.

Among the transparent conductive layer 343A and the reflective layer 342A that constitute each of the anodes 341A, the transparent conductive layer 343A may be electrically connected to the source electrode 323A. Referring to FIG. 3A, the reflective layer 342A may be formed on the over-coating layer 335A and a contact hole may be formed in the over-coating layer 335A so as to electrically connect the transparent conductive layer 343A and the source electrode 323A. Although for convenience of explanation, FIG. 3A illustrates that the transparent conductive layer 343A is electrically connected to the source electrode 323A, the reflective layer 342A may be electrically connected to the source electrode 323A via the contact hole formed in the over-coating layer 335A and the transparent conductive layer 343A may be formed on the reflective layer 342A to be electrically connected to the source electrode 323A via the reflective layer 342A.

The anodes 341A are formed to be divided in units of the sub pixel regions. In other words, the anode 341A formed in a red sub pixel region, the anode 341A formed in a green sub pixel region, and the anode 341A formed in a blue sub pixel region may individually and electrically drive the corresponding sub pixel regions through the thin film transistor.

A bank layer 336A is formed on the over-coating layer 335A and the anode 341A. The bank layer 336A divides adjacent sub pixel regions and may be disposed between adjacent sub pixel regions. Also, the bank layer 336A may be formed such that a portion of the anode 341A is open. The bank layer 336A may be formed of an organic insulating material, e.g., any one of polyimide, photo acryl, and benzocyclobutene (BCB). The bank layer 336A may be formed in a taper. When the bank layer 336A has a taper form, the bank layer 336A may be formed using a positive type photoresist. The bank layer 336A may be formed to a thickness appropriate to divide adjacent sub pixel regions.

The multi-layered emission layer structure 344A including the first EL layer 344A1 and the second EL layer 344A2 is formed on the anode 341A. In the EL layer 344A, the first EL layer 344A1 is formed in the first sub pixel region R and the second sub pixel region G of the first substrate 310A, and the second EL layer 344A2 is formed in the first sub pixel region R, the second sub pixel region G and the third sub pixel region B of the first substrate 310A. Thus, in the EL layer 344A, the second EL layer 344A2 is formed on the first anode 341A1 corresponding to the first sub pixel region R, the second anode 341A2 corresponding to the second sub pixel region G, and the third anode 341A3 corresponding to the third sub pixel region B, and the first EL layer 344A1 is formed on the first anode 341A1 corresponding to the first sub pixel region R and the second anode 341A2 corresponding to the second sub pixel region G. The first EL layer 344A1 is formed on the second EL layer 344A2. That is, the second EL layer 344A2 is formed on a surface of the first anode 341A1, a surface of the second anode 341A2, and a surface of the third anode 341A3, and the first EL layer 344A1 is formed on a surface of the second EL layer 344A2 corresponding to the first and second anodes 341A1 and 341A2.

Lights emitted from the respective first and second EL layers 344A1 and 344A2 are different and are mixed to form white light. Specifically, the second EL layer 344A2 may be a blue emission layer that emits blue light, and the first EL layer 344A1 may be a multi-layered emission layer structure 344A that emits various other color lights that are mixed with the blue light to form white light. The first EL layer 344A1 and the second EL layer 344A2 are substantially the same as the first multi-layered emission layer structure 244A1 and the second multi-layered emission layer structure 244A2 described above with reference to FIG. 2A, and are thus not redundantly described here.

The second EL layer 344A2 may be formed to a thickness appropriate to form a micro-cavity in the third sub pixel region B. The micro-cavity means that light having a particular wavelength is amplified by constructive interference when lights are repeatedly reflected between two layers spaced by an optical length from each other. The micro-cavity may also be referred to as a fine cavity effect or a fine resonance effect. To form the micro-cavity, a resonance distance should be set in units of wavelengths of lights emitted from the respective sub pixel regions. The resonance distance may be set to a multiple of a half-wavelength of light emitted. As described above, when a resonance distance is set with respect to light with a particular wavelength, the amplitudes of lights having the particular wavelength among lights emitted increase to be discharged to the outside due to constructive interference as these lights are repeatedly reflected between the anode 341A and the cathode 345A, thereby improving luminance.

In contrast, as the other lights not having the particular wavelength among the emitted lights are repeatedly reflected between the anode 341A and the cathode 345A, the amplitudes of the lights not having the particular wavelength decrease due to destructive interference. Thus, in order to form the micro-cavity in the third sub pixel region B, the distance between the anode 341A and the cathode 345A in the third sub pixel region B should be adjusted. Specifically, the distance between the anode 341A and the cathode 345A in the third sub pixel region B should be equal to a multiple of a half-wavelength of blue visible light. In the organic light emitting display device 300A according to another exemplary embodiment of the present invention, the thickness of the second EL layer 344A2 disposed between the anode 341A and the cathode 345A may be set to a multiple of the half-wavelength of blue visible light, thereby forming the micro-cavity in the third sub pixel region B.

The cathode 345A is formed on the EL layer 344A. Since the cathode 345A should supply electrons, the cathode 345A is formed of a material having high electrical conductivity and a low work function, i.e., a material of a cathode. Specifically, a material of the cathode 345A may depend on the light-emitting manner of the organic light emitting display device 300A. When the organic light emitting display device 300A is a top emission type organic light emitting display device as illustrated in FIG. 3A, the cathode 345A may be formed of a very thin metal material having a low work function. For example, when the cathode 345A is formed of a metal material having a low work function, the cathode 345A may be obtained by forming a metal material such as silver (Ag), titanium (Ti), aluminum (Al), molybdenum (Mo), or an alloy of silver (Ag) and magnesium (Mg) to a thickness of several hundreds of Å or less, e.g., 200 Å or less. In this case, the cathode 345A becomes a substantial semi-transmissive layer to be substantially used as a transparent cathode.

Even if a material of the cathode 345A is a non-transparent material having high reflectivity, when the cathode 345A becomes thinner to a predetermined thickness or less, e.g., 200 Å of less, the transparency of the cathode 345A gradually increases. The cathode 345A having such a thickness may be referred to as a substantial transparent cathode. Also, a carbon nano tube and graphene to which much attention has been paid as new materials may also be used as a material of the cathode 345A.

The encapsulating unit 360A formed as a sealing member for covering the organic light emitting element 340A is formed on the organic light emitting element 340A including the cathode 345A. The encapsulating unit 360A may protect internal elements of the organic light emitting display device 300A, such as the thin film transistor 320A and the organic light emitting element 340A, against external moisture, air, shocks, etc.

The structure of the encapsulating unit 360A may depend on a method of sealing the internal elements of the organic light emitting display device 300A such as the thin film transistor 320A and the organic light emitting element 340A. Examples of the method of sealing the organic light emitting display device 300A include metal can encapsulation, glass can encapsulation, thin film encapsulation (TFE), face sealing, etc.

The second substrate 315A is a substrate configured to support and to protect various elements of the organic light emitting display device 300A, and is disposed opposite the first substrate 310A. The color filter 390A is formed on the second substrate 315A. The color filter 390A includes a first color filter 391A formed in the first sub pixel region R, and a second color filter 392A formed in the second sub pixel region G. The first color filter 391A is a red color filter formed in the first sub pixel region R that is a red sub pixel region, and the second color filter 392A is a green color filter formed in the second sub pixel region G that is a green sub pixel region. Thus, white light passing through the first sub pixel region R and the second sub pixel region G among white lights emitted from the multi-layered emission layer structure 344A that emits white light passes through the color filter 390A. In detail, white light passing through the first color filter 391A is transformed into red light, and white light passing through the second color filter 392A is transformed into green light.

The color filter 390A is not formed on the second substrate 315A corresponding to the third sub pixel region B. However, a portion of the multi-layered emission layer structure 344A formed in the third sub pixel region B is the second EL layer 344A2 corresponding to a blue emission layer. Thus, even if the color filter 390A is not formed in the third sub pixel region B, blue light may be emitted from the third sub pixel region B. In some embodiments, a transparent resin layer having the same thickness as the color filter 390A may be formed on the second substrate 315A corresponding to the third sub pixel region B.

Figure 3B:
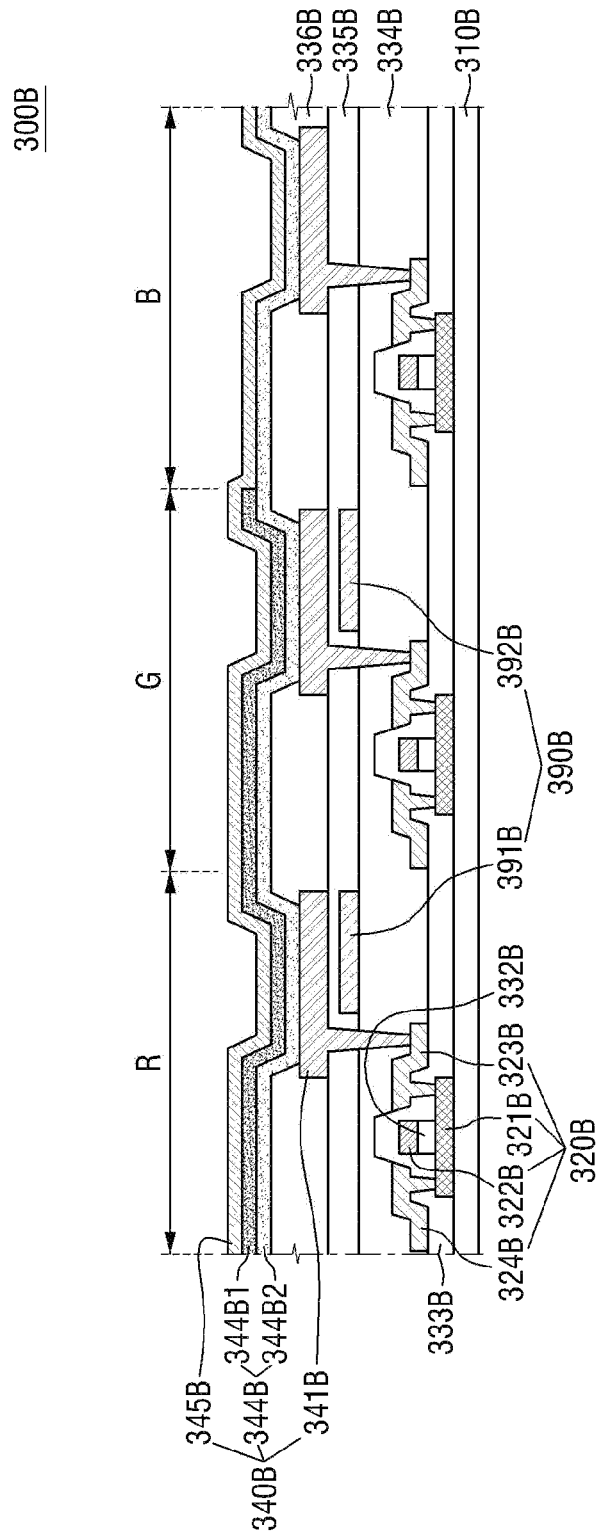
Figure 3C:
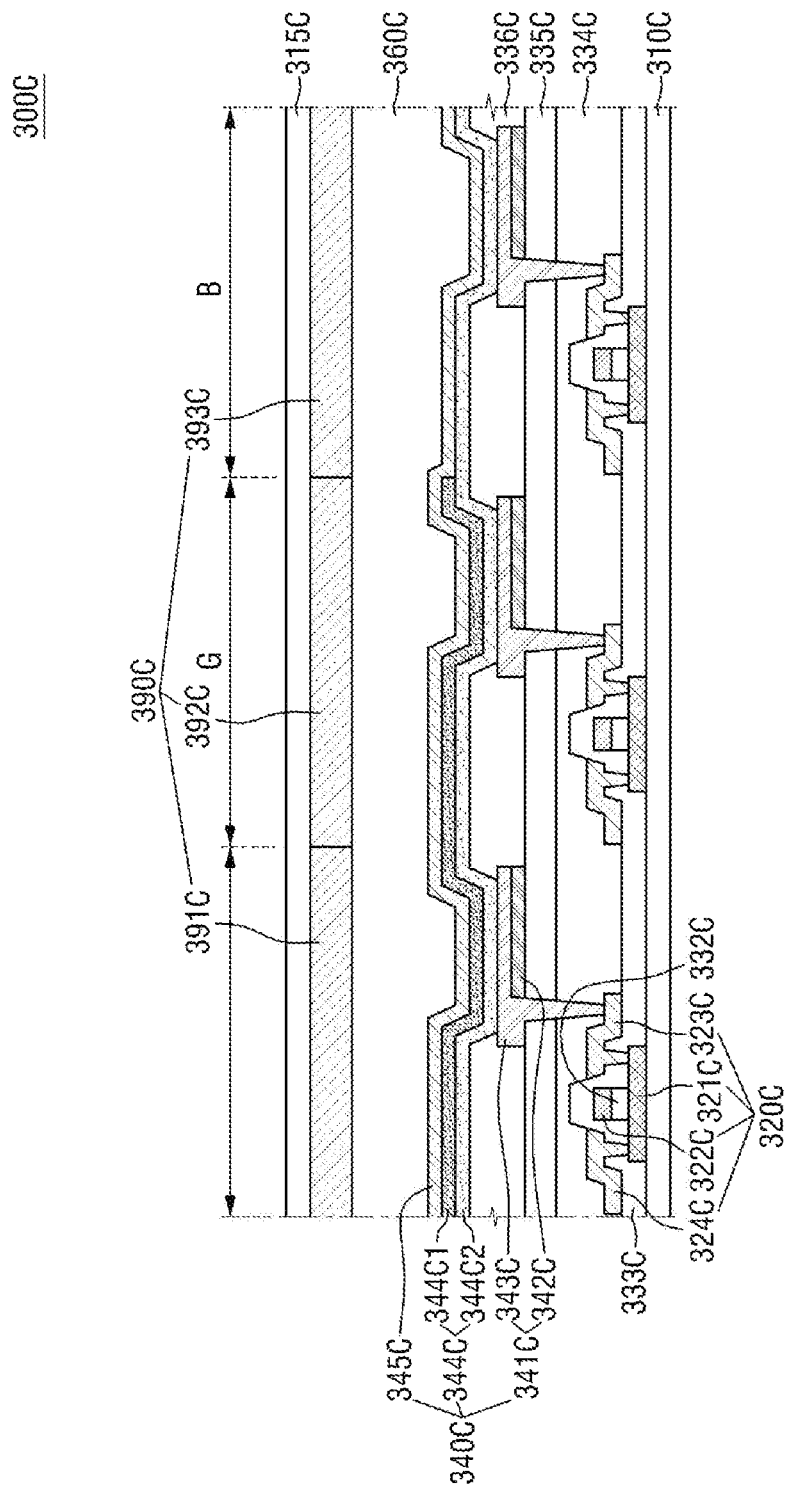
Figure 3D:
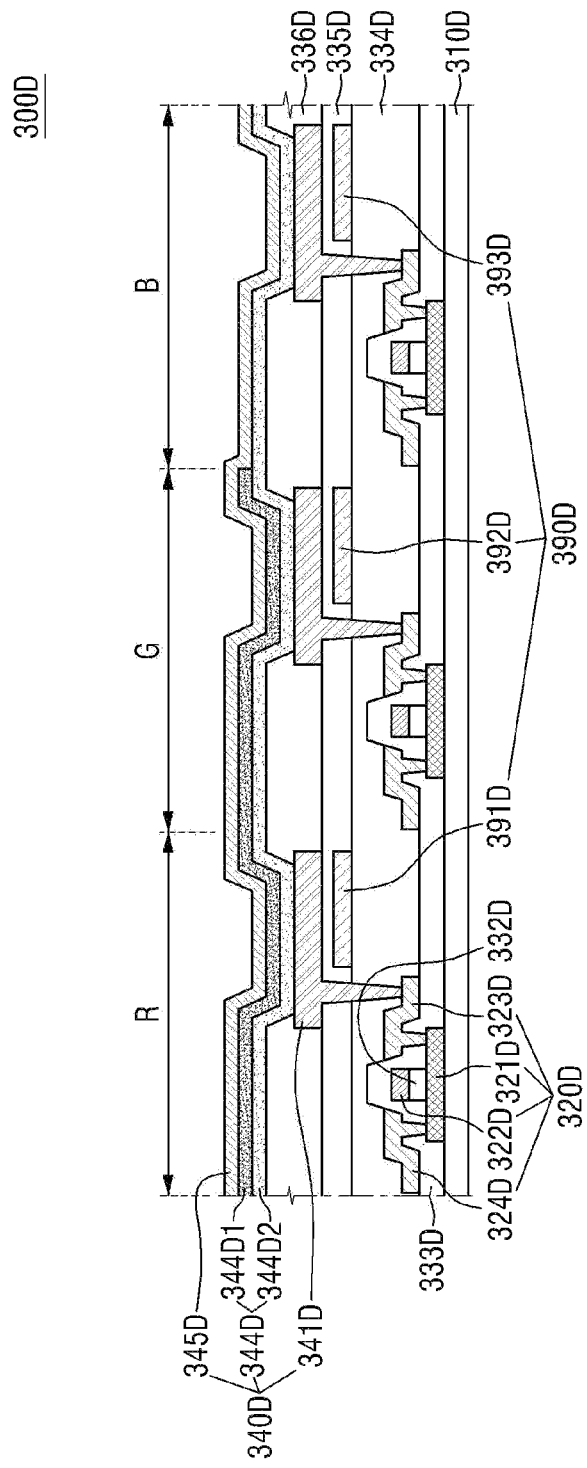

FIG. 3D is a pictorial representation (through a cross sectional view) depicting an organic light emitting display device 300B according to an exemplary embodiment of the present invention. Elements illustrated in FIG. 3B are substantially the same as those in FIG. 3A when numbers assigned thereto (except for alphabets) are the same and are thus not redundantly described here. FIG. 3B illustrates that the organic light emitting display device 300B is a bottom emission type organic light emitting display device.

When the organic light emitting display device 300B is a bottom emission type organic light emitting display device, an anode 341B may be formed of transparent conductive material having a high work function, e.g., indium tin oxide (ITO), indium zinc oxide (IZO), indium-tin-zinc oxide (ITZO), zinc oxide, or tin oxide.

When the organic light emitting display device 300B is a bottom emission type organic light emitting display device, a cathode 345B may be formed of a conductive material having a low work function and high reflectivity, e.g., a metal material such as silver (Ag), titanium (Ti), aluminum (Al), molybdenum (Mo), or an alloy of silver (Ag) and magnesium (Mg).

When the organic light emitting display device 300B is a bottom emission type organic light emitting display device, a color filter 390B may be formed between a first substrate 310B and an organic light emitting element 340B. Although FIG. 3B illustrates that the color filter 390B is formed on the passivation film 334B, the color filter 390B may be formed in an arbitrary space between the first substrate 310B and the organic light emitting element 340B. For example, the color filter 390B may be formed on the interlayer insulating film 333B or the first substrate 310B.

FIG. 3C is a pictorial representation (through a cross sectional view) depicting an organic light emitting display device 300C according to an exemplary embodiment of the present invention. Elements illustrated in FIG. 3C are substantially the same as those in FIG. 3A when numbers assigned thereto (except for alphabets) are the same and are thus not redundantly described here.

A color filter 390C formed on a second substrate 315C includes a third color filter 393C. Specifically, the third color filter 393C serving as a blue color filter is formed in a third sub pixel region B that is a blue sub pixel region.

As described above, since a second EL layer 344C2 is formed in the third sub pixel region B, which is a blue sub pixel region, blue light is emitted from the EL layer 344C in the third sub pixel region B that is a blue sub pixel region. Thus, blue light may be transmitted in the third sub pixel region B even if an additional color filter is disposed. In the third sub pixel region B, which is a blue sub pixel region, the EL layer 344C emits blue light. Luminance efficiency is hardly degraded when the blue light passes through the third color filter 393C which is a blue color filter. Thus, even if the third color filter 393C is disposed in the third sub pixel region B, not only the luminance efficiency is hardly degraded but also a contrast ratio may be improved in the third sub pixel region B which is a blue sub pixel region.

FIG. 3D is a pictorial representation (through a cross sectional view) depicting an organic light emitting display device 300D according to an exemplary embodiment of the present invention. Elements illustrated in FIG. 3D are substantially the same as those in FIG. 3B when numbers assigned thereto (except for alphabets) are the same and are thus not redundantly described here.

A color filter 390D formed between a first substrate 310D and an organic light emitting element 340D includes a third color filter 393D. In detail, the third color filter 393D serving as a blue color filter is formed in a third sub pixel region B which is a blue sub pixel region. Thus, white light passing through the third sub pixel region B among white lights emitted from an EL layer 344D that emits white light passes through the third color filter 393D and is then transformed into blue light.

As described above, since only a second EL layer 344D2 is formed in the third sub pixel region B which is a blue sub pixel region, blue light is emitted from the EL layer 344D in the third sub pixel region B which is a blue sub pixel region. Thus, blue color may be represented in the third sub pixel region B even when an additional color filter is installed. The EL layer 344D emits blue light in the third sub pixel region B that is a blue sub pixel region. Since luminance efficiency is hardly degraded when the blue light passes through the third color filter 393D which is a blue filter, not only the luminance efficiency is hardly degraded even when the third color filter 393D is disposed in the third sub pixel region B but also a contrast ratio may be improved in the second area Y including the third sub pixel region B.

Figure 3E:
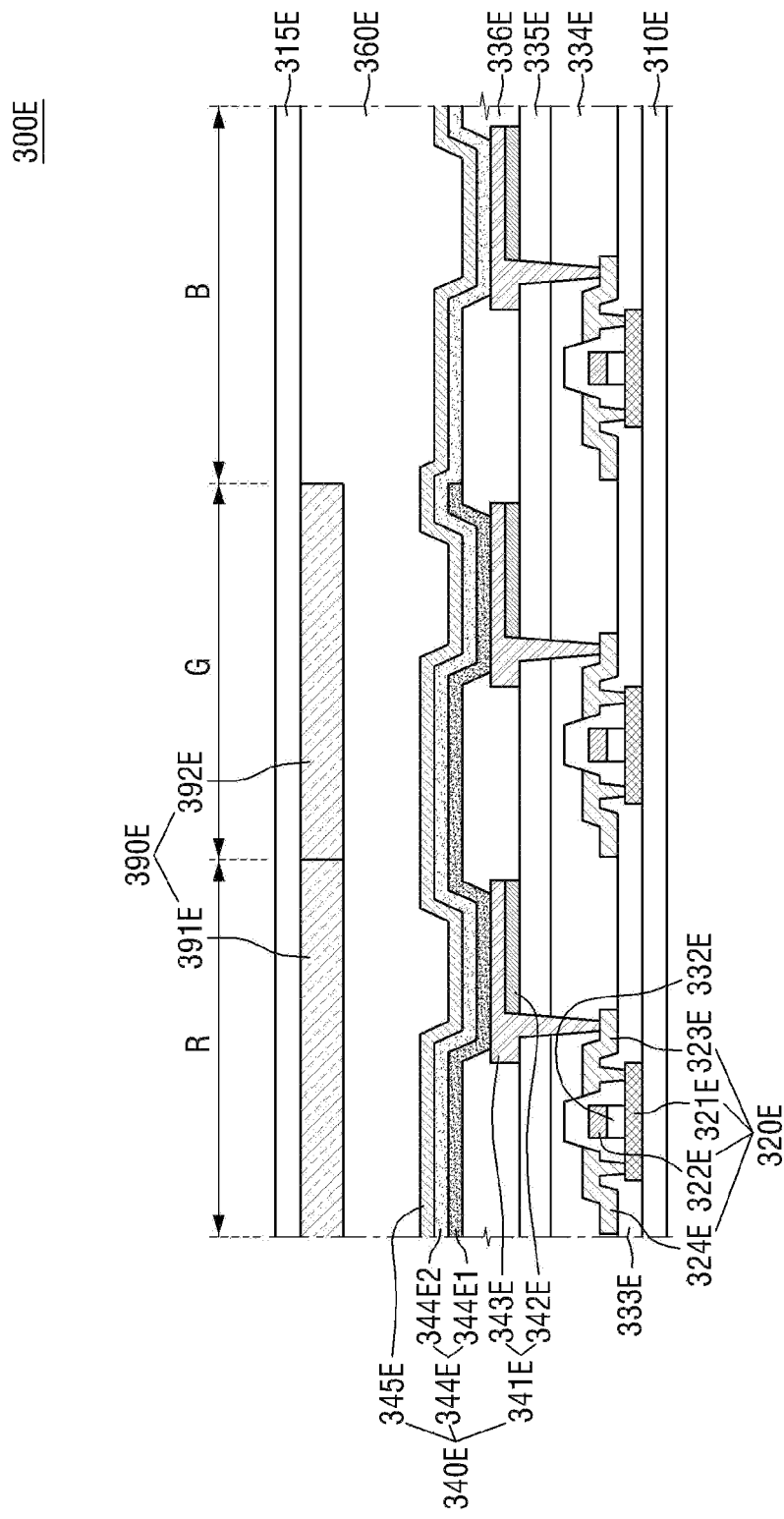

FIG. 3E is a pictorial representation (through a cross sectional view) depicting an organic light emitting display device 300E according to an exemplary embodiment of the present invention. Elements illustrated in FIG. 3E are substantially the same as those in FIG. 3A when numbers assigned thereto (except for alphabets) are the same and are thus not redundantly described here.

An EL layer 344E including a first EL layer 344E1 and a second EL layer 344E2 is formed on an anode 341E. In the EL layer 344E, the first EL layer 344E1 is formed in the first sub pixel region R and the second sub pixel region G of a first substrate 310E and the second EL layer 344E2 is formed in t the first sub pixel region R, the second sub pixel region G and the third sub pixel region B of the first substrate 310E. Thus, in the EL layer 344E, the first EL layer 344E1 is formed on a first anode 341E1 corresponding to the first sub pixel region R and the second anode 341E2 corresponding to the second sub pixel region G, and the second EL layer 344E2 is formed on the first EL layer 344E1 corresponding to the first sub pixel region R and the second sub pixel region G and a third anode 341E3 corresponding to the third sub pixel region B. A process of forming the first and second EL layers 344E1 and 344E2 according to a manner of stacking the first and second EL layers 344E1 and 344E2 will be described below.

Lights emitted from the respective first and second EL layers 344E1 and 344E2 are different and are mixed to form white light. Specifically, the second EL layer 344E2 may be a blue emission layer that emits blue light, and the first EL layer 344E1 may be EL layer that emits other various color lights that are mixed with the blue light to form white light. The first and second EL layers 344E1 and 344E2 are substantially the same as the first and second EL layers 244A1 and 244A2 of FIG. 2A and are thus not redundantly described here.

Figure 3F:
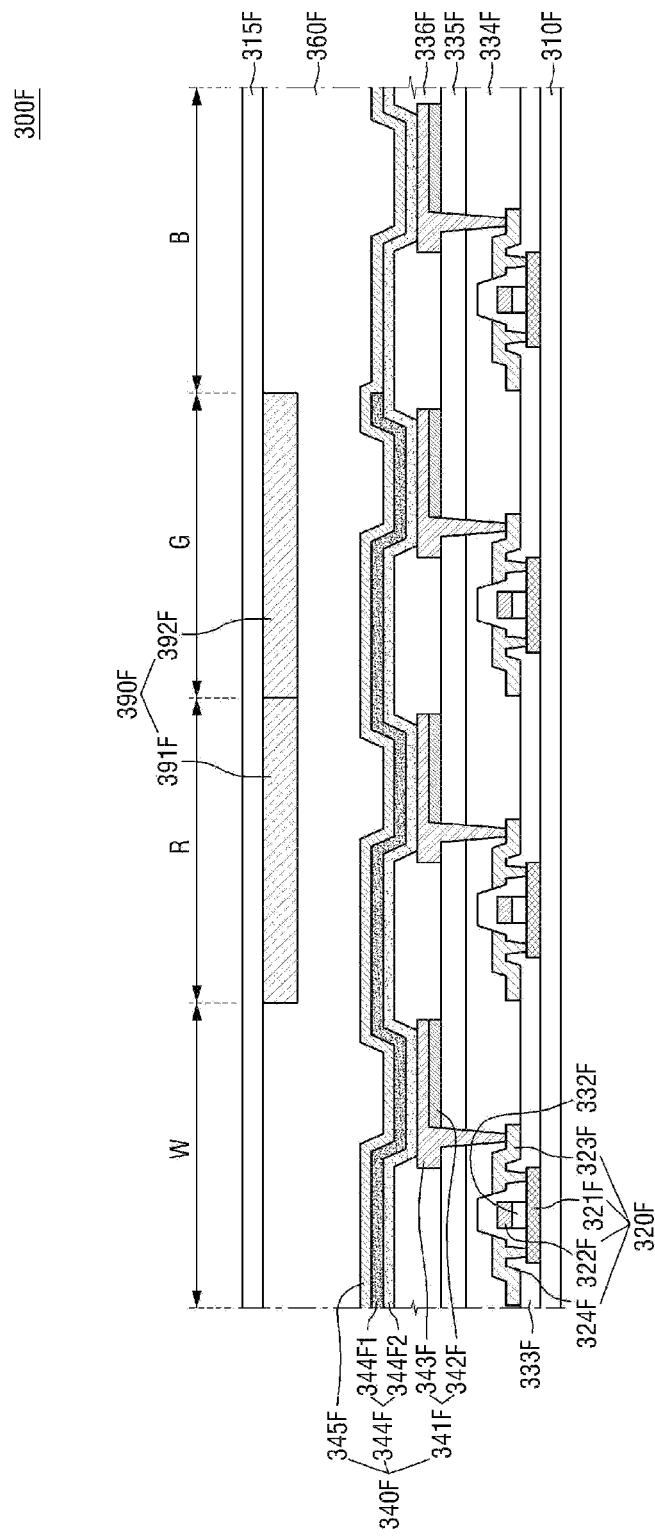

FIG. 3F is a pictorial representation (through a cross sectional view) depicting an organic light emitting display device 300F according to an exemplary embodiment of the present invention. Elements illustrated in FIG. 3F are substantially the same as those in FIG. 3A when numbers assigned thereto (except for alphabets) are the same and are thus not redundantly described here.

The organic light emitting display device 300F may include pixel regions. Each of the pixel regions is a region for representing one color and may include a plurality of sub pixel regions. For example, each of the plurality of pixel regions may include a first sub pixel region R, a second sub pixel region G, a third sub pixel region B, and a fourth sub pixel region W. Here, it is defined that the first sub pixel region R is a red sub pixel region, the second sub pixel region G is a green sub pixel region, the third sub pixel region B is a blue sub pixel region, and the fourth sub pixel region W is a white sub pixel region configured to reduce power consumption and improve brightness.

An anode 341F is formed in the fourth sub pixel region W of the first substrate 310F. An EL layer 344F including a first EL layer 344F1 and a second EL layer 344F2 is formed on the anode 341F. A cathode 345F is formed on the EL layer 344F. Since both the first EL layer 344F1 and the second EL layer 344F2 are formed in the fourth sub pixel region W, lights emitted from the respective first and second EL layers 344F1 and 344F2 are mixed to emit white light in the fourth sub pixel region W.

Since the fourth sub pixel region W is a white sub pixel region, a color filter 390F is not formed on a second substrate 315F corresponding to the fourth sub pixel region W. However, the present invention is not limited thereto and a transparent resin layer having the same thickness as the color filter 390F may be disposed on a location on the second substrate 315F corresponding to the third sub pixel region B.

Figure 4A:
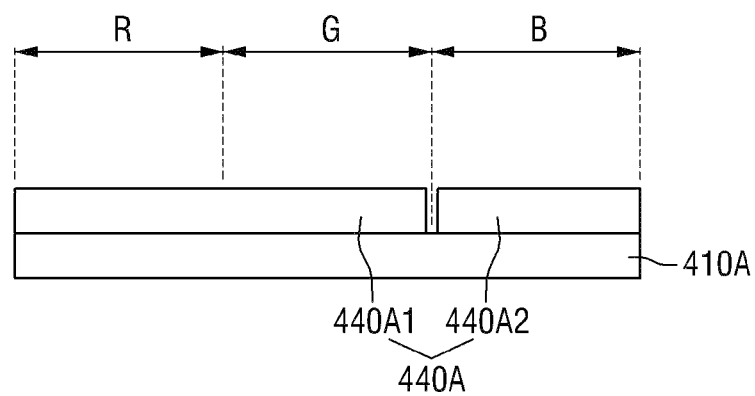
FIGS. 4A to 4D, each illustrates a cross-sectional view of an exemplary display device according to an embodiment of the present invention.
Figure 4B:
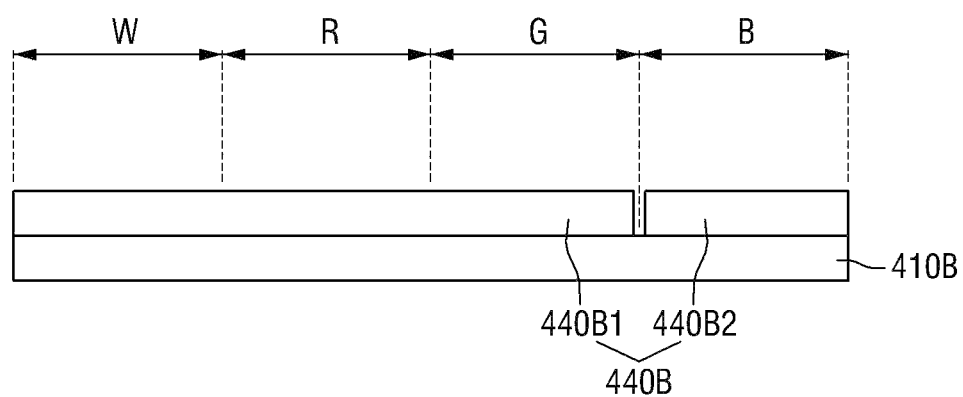

FIGS. 4A and 4B are conceptual diagrams illustrating organic light emitting display devices 400A and 400B according to various exemplary embodiments of the present invention.

First, referring to FIG. 4A, the organic light emitting display device 400A includes a first substrate 410A and an organic light emitting element 440A. The first substrate 410A is substantially the same as the first substrate 310A of FIG. 3A and is not redundantly described here.

The first substrate 410A includes a first sub pixel region R which is red sub pixel region, a second sub pixel region G which is a green sub pixel region, and a third sub pixel region B which is a blue sub pixel region. The organic light emitting element 440A includes a first organic light emitting element 440A1 and a second organic light emitting element 440A2. The first organic light emitting element 440A1 is formed in the first sub pixel region R, which is a red sub pixel region and the second sub pixel region G, which is a green sub pixel region, and emits white light. The second organic light emitting element 440A2 is formed in the third sub pixel region B, which is a blue sub pixel region, and emits blue light.

Next, referring to FIG. 4B, the organic light emitting display device 400B includes a first substrate 410B and an organic light emitting element 440B. The first substrate 410B is substantially the same as the first substrate 310A of FIG. 3A and is thus not redundantly described here.

The first substrate 410B includes a first sub pixel region R which is red sub pixel region, a second sub pixel region G which is a green sub pixel region, a third sub pixel region B which is a blue sub pixel region, and a fourth sub pixel region W which is a white sub pixel region. The organic light emitting element 440B includes a first organic light emitting element 440A1 and a second organic light emitting element 440A2. The first organic light emitting element 440A1 is formed in the first sub pixel region R, which is red sub pixel region, the second sub pixel region G that is a green sub pixel region, and the fourth sub pixel region W that is a white sub pixel region, and emits white light. The second organic light emitting element 440A2 is formed in the third sub pixel region B, which is a blue sub pixel region, and emits blue light.

The first organic light emitting elements 440A1 and 440B1 and the second organic light emitting elements 440A2 and 440B2 will be described in greater detail with reference to FIGS. 4B and 4C below.

Figure 4C:
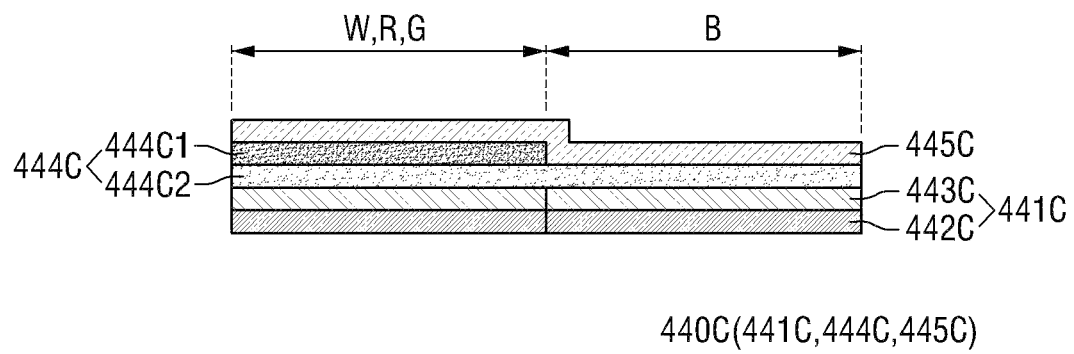

FIG. 4C is a conceptual diagram illustrating an organic light emitting display devices 400C according to another exemplary embodiments of the present invention.

A first organic light emitting element is a portion of an organic light emitting element 440C formed in a first sub pixel region R which is a red sub pixel region, a second sub pixel region G which is a green sub pixel region, and a fourth sub pixel region W which is a white sub pixel region. The first organic light emitting element includes an anode 441C, an EL layer 444C, and a cathode 445C. The EL layer 444C includes a first EL layer 444C1 and a second EL layer 444C2. The second EL layer 444C2 may be an emission layer that emits blue light, and the first EL layer 444C1 may be an emission layer that emits other various color lights that are mixed with the blue light to emit white light. The first EL layer 444C1 and the second EL layer 444C2 are substantially the same as the first EL layer 244C1 and the second EL layer 244C2 of FIG. 2A, and are thus not redundantly described here. Since FIG. 4C illustrates that the organic light emitting display device 400C is a top emission type organic light emitting display device, the anode 441C includes a transparent conductive layer 443C and a reflective layer 442C.

A second organic light emitting element is a portion of the organic light emitting element 440C formed in a third sub pixel region B, which is a blue sub pixel region. The second organic light emitting element includes the anode 441C, the EL layer 444C, and the cathode 445C, and the EL layer 444C includes the second EL layer 444C2. The second EL layer 444C2 is an emission layer that emits blue light. Since FIG. 4C illustrates that the organic light emitting display device 400C is a top emission type organic light emitting display device, the anode 441C includes a transparent conductive layer 443C and a reflective layer 442C.

The anodes 441C, the second EL layers 444C2, and the cathodes 445C of the respective first and second organic light emitting elements may be simultaneously formed in the same process. Specifically, the anodes 441C of the first and second organic light emitting elements may be simultaneously formed of the same material and to the same thickness in the same process. The second EL layers 444C2 of the first and second organic light emitting elements may be simultaneously formed of the same material and to the same thickness in the same process. The cathodes 445C of the first and second organic light emitting elements may be simultaneously formed of the same material and to the same thickness in the same process.

Although for convenience of explanation, the organic light emitting display devices 400C of FIG. 4C has been described relating to the organic light emitting display device 400B of FIG. 4B, the organic light emitting display devices 400C is substantially the same as the organic light emitting display device 400A of FIG. 4A except for the fourth sub pixel region W.

Figure 4D:
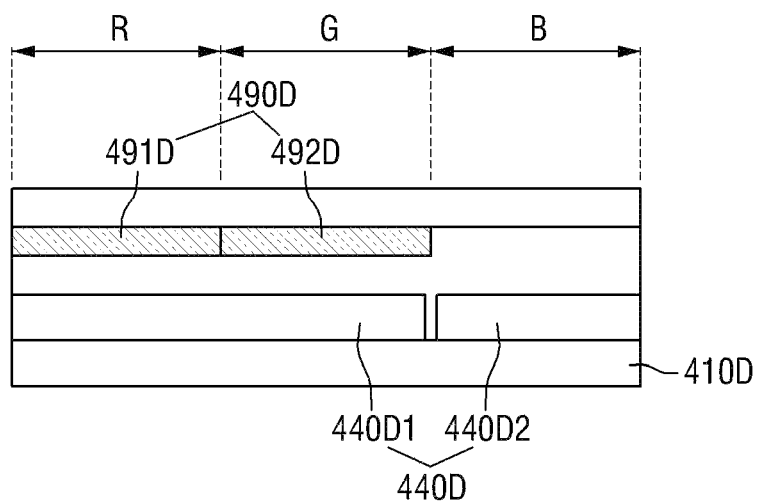

FIG. 4D is a conceptual diagram illustrating an organic light emitting display device 400D according to another exemplary embodiment of the present invention. Elements illustrated in FIG. 4D are substantially the same as those in FIG. 4A when numbers assigned thereto (except for alphabets) are the same and are thus not redundantly described here.

Referring to FIG. 4D, a color filter 490D including a first color filter 491D and a second color filter 492D is formed on a second substrate 415D corresponding to a first sub pixel region R which is a red sub pixel region and a second sub pixel region G which is a green sub pixel region. The first color filter 491D corresponds to the first sub pixel region R that is a red sub pixel region, and the second color filter 492D corresponds to the second sub pixel region G that is a green sub pixel region. Thus, white light emitted from the first organic light emitting element 440D1 passes through the first color filter 491D and is then transformed into red light, and passes through the second color filter 492D and is then transformed into green light. The color filter 490D and the second substrate 415D are substantially the same as the color filter 390A and the second substrate 315A of FIG. 3A and are thus not redundantly described here.

Figure 5:
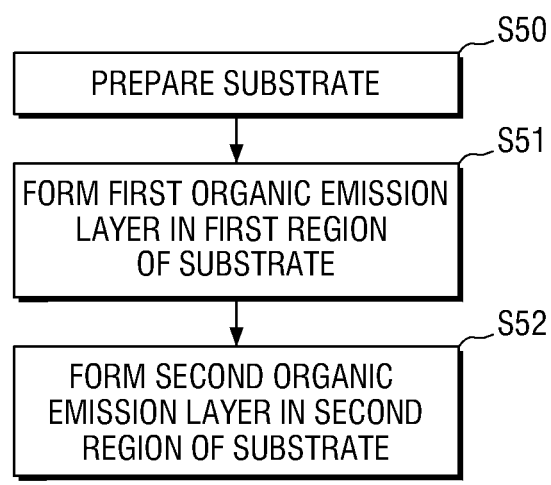
FIG. 5 is a flowchart illustrating steps for manufacturing an organic light emitting display device according to an exemplary embodiment of the present invention.
Figure 6A:
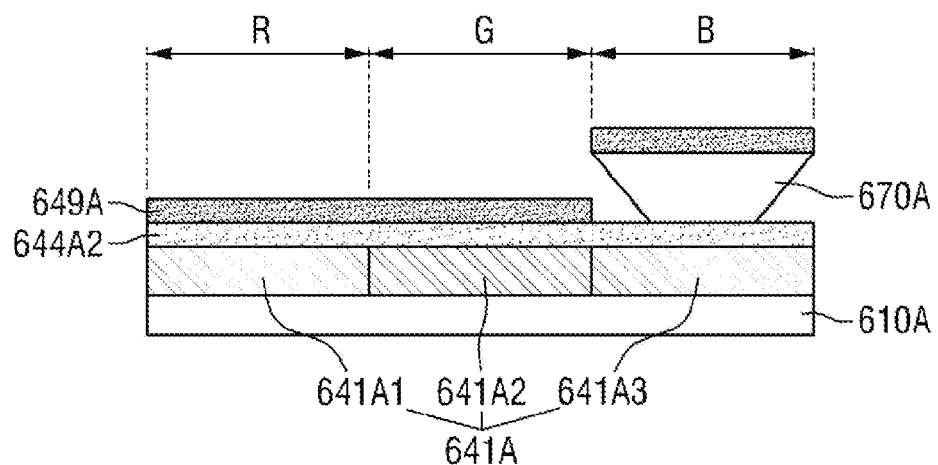
FIGS. 6A and 6B illustrate cross-sectional views of the exemplary display device during the steps of manufacturing such organic light emitting display device according to an exemplary embodiment of the present invention.
Figure 6B:
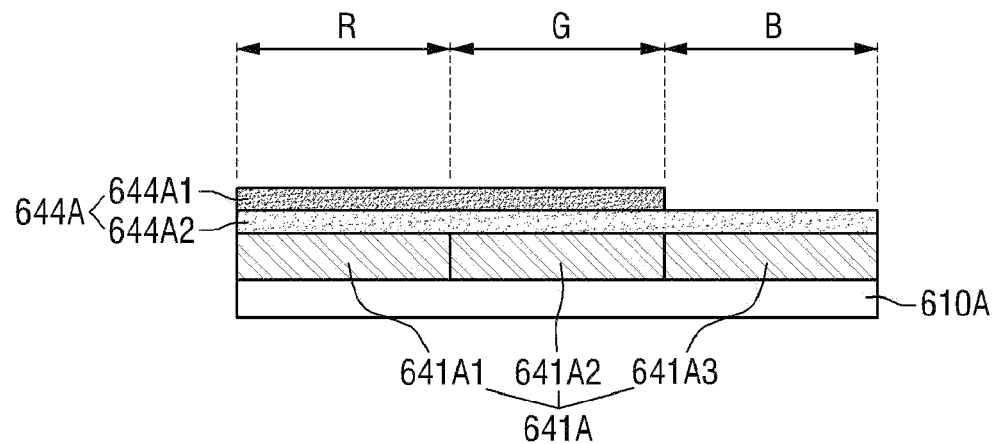

FIG. 5 is a flowchart illustrating a method of manufacturing an organic light emitting display device according to an exemplary embodiment of the present invention. FIGS. 6A and 6B are cross-sectional views sequentially illustrating a method of manufacturing an organic light emitting display device according to an exemplary embodiment of the present invention.

Referring to FIG. 5, first, a plurality of anodes is formed on a substrate so that each of the anodes is individually addressable. Then, a first electroluminescent (EL) layer and a second electroluminescent (EL) layer are formed on the anodes such that at least a part of the first EL layer and the second EL layer are overlapped at the first area (e.g., an area for emitting substantially white light) of the display device. Here, at least one of the first EL layer or the second EL layer should be formed such that it is extended out to a second area (e.g., an area for emitting constituent colored light of the EL layer) without being overlapped with the other EL layer. A cathode is formed on both the first area and the second area so that the first EL layer and the second EL layer are interposed between the plurality of anodes and the cathode. Then, one or more of color filter elements are arranged to filter the light emitted from the first area.

In this setting, the EL layer being extended out to the second area may emit its own colored light without being filtered by a color filter element while the stack of the first and second EL layers in the first area emits substantially white light, which is to be filtered by one or more of the color filter elements to generate colored light corresponding to the color filter element.

When forming the first and second EL layers, one of the first and second EL layers, which is to be extended out into the second area may be formed first. Then a photoresist may be formed on the EL layer in the second area. The photoresist in the second area is then developed. Following the development of the photoresist, the other EL layer that is to be left in the first area (i.e., complementary EL layer) is formed in the first and second areas. When the photoresist formed in the second area is stripped, the complementary EL layer formed in the second area is also stripped, thereby forming a multi-layered emission layer structure having the first area for emitting white light and the second area for emitting colored light of the EL layer. In some embodiments of the method, the photoresist developing solution and/or the photoresist stripper used in the process of forming the multi-layered emission layer structure contain fluorine, which may reduce the damage to the EL layers during the formation of the multi-layered emission layer structure.

As an alternative way of forming the multi-layered emission layer structure, one of the first and second EL layers can be formed in the first area, and the other EL layer can be formed on the EL layer in both the first and second areas. This method also results in a multi-layered emission layer structure with a stack of the first and second EL layers disposed in the first area for emitting the substantially white light and one of the first and second EL layers being extended into the second area for emitting colored light of the EL layer in the second area.

In one embodiment, the EL layer being extended out into the second area is an EL layer configured to emit substantially blue light, and the other EL layer, which is contained within the first area, is an EL layer configured to emit light having a color complementary to the blue light from the other EL layer. Accordingly, these two EL layers overlap at the first area and collectively emit substantially white light. In this embodiment, the plurality of color filter elements comprises a red color filter element and a green color filter element that are configured to filter the white light to generate red and green light, respectively. In other embodiments, the EL layer being extended out into the second area may be configured to emit substantially red or substantially green colored light, and the other EL layer being contained within the first area may be configured to emit light that is complementary to the red or green colored light. As such, the display device having a multi-layered emission layer structure with improved luminance, color accuracy, power consumption as well as the longer life span can be provided.

The forming of the first EL layer in the first region of the substrate and the forming of the second EL layer in the second region of the substrate will be described in more detail with reference to FIGS. 6A to 6C.

As depicted in FIG. 6A, a first anode 641A1 and a second anode 641A2 are formed in a first sub pixel region R and a second sub pixel region G corresponding to a first region of a substrate 610A, respectively, and a third anode 641A3 is formed in a third sub pixel region B corresponding to a second region of the substrate 610A.

Next, a second EL layer 644A2 is formed on a first anode 641A1, a second anode 641A2, and a third anode 641A3. The forming of the second EL layer 644A2 includes forming a blue emission layer.

Next, a first EL layer 644A1 is formed on the second EL layer 644A2. The forming of the first EL layer 644A1 includes forming an EL layer 644A that emits various color lights that are mixed with blue light to form white light. The first EL layer 644A1 is substantially the same as the first multi-layered emission layer structure 244A1 of FIG. 2A and is thus not redundantly described here.

The forming of the first EL layer 644A1 may include forming the first EL layer 644A1 using photolithographic process. When the photolithographic process is used, first, a photoresist is formed on the second EL layer 644A2 corresponding to the third sub pixel region B. The forming of the photoresist 670A may include applying a photoresist on the entire second EL layer 644A2, and performing exposure and development on the photoresist to form the photoresist 670A on the second EL layer 644A2 corresponding to the third sub pixel region B. In this case, since the second EL layer 644A2 is formed below the photoresist 670A, the second EL layer 644A2 may be damaged during the exposure and development of the photoresist 670A. In the method of manufacturing an organic light emitting display device according to an exemplary embodiment of the present invention, the photoresist 670A, a developing solution, and a stripper may be formed of a material containing fluorine to minimize damage to the EL layer 644A when the photoresist 670A is developed and removed.

In some embodiments, before the photoresist 670A is formed, a protective layer may be formed on the second EL layer 644A2 to protect the second EL layer 644A2 during the photolithographic process. A charge generation layer may be used as the protective layer. By forming the charge generation layer on the second EL layer 644A2, damage to the EL layer 644A that may occur during the photolithography may be minimized.

Then, a first EL layer 644A1 is formed on the second EL layer 644A2 on which the photoresist 670A is formed. Since the first EL layer 644A1 is formed by depositing an organic light emitting material 649A and the photoresist 670A is formed in the third sub pixel region B, the organic light emitting material 649A is formed on the second EL layer 644A2 in the first sub pixel region R and in the second sub pixel region G and on the photoresist 670A and in the third sub pixel region B.

Then, referring to FIG. 6B, the photoresist 670A is removed from the third sub pixel region B. When the photoresist 670A is removed, the organic light emitting material 649A formed on the photoresist 670A is also removed. As described above, the photoresist 670A may be formed of a material containing fluorine, and a developing solution and a stripper may also be formed of a material containing fluorine. By using the developing solution and the stripper that contain fluorine, damage to the EL layer 644A may be minimized during the developing and removing of the photoresist 670A.

Figure 7A:
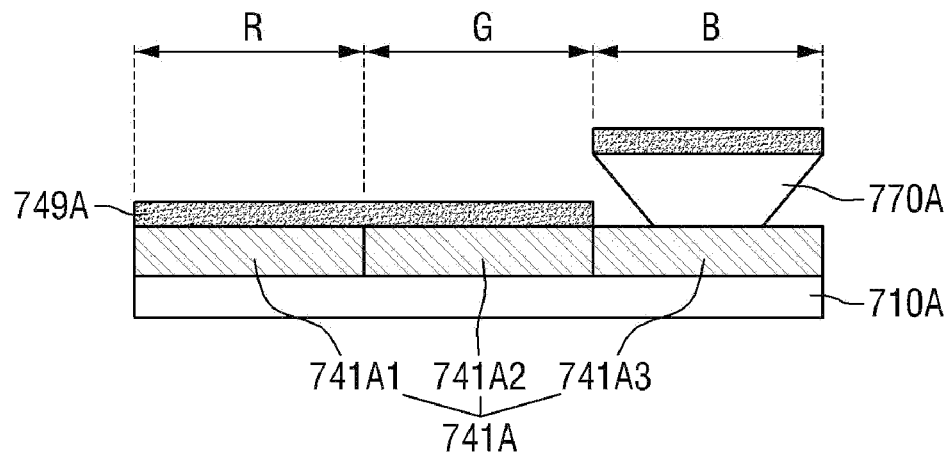
FIGS. 7A and 7C illustrate cross-sectional views of the exemplary display device during the steps of manufacturing such organic light emitting display device according to an exemplary embodiment of the present invention.
Figure 7B:
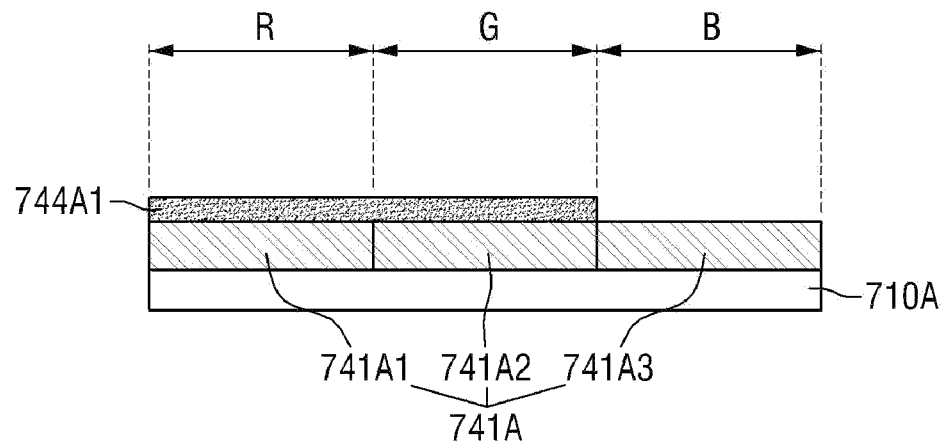
Figure 7C:
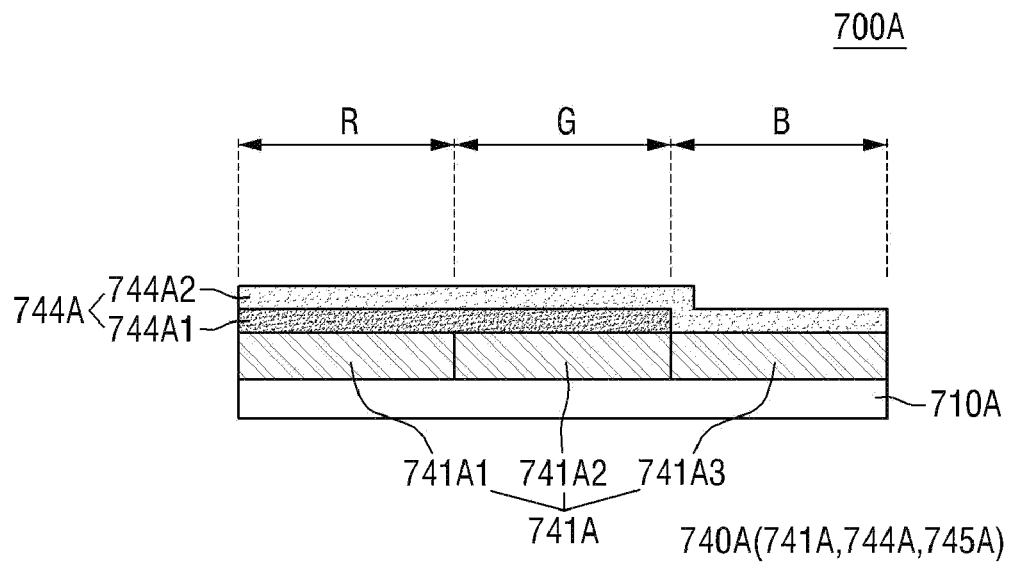

FIGS. 7A to 7C are cross-sectional views sequentially illustrating a method of manufacturing an organic light emitting display device according to another exemplary embodiment of the present invention.

First, referring to FIG. 7A, a first anode 741A1 and a second anode 741A2 are formed in a first sub pixel region R and a second sub pixel region G corresponding to a first region of a substrate 710A, respectively, and a third anode 741A3 is formed in a third sub pixel region B corresponding to a second region of the substrate 710A.

A first EL layer 744A1 is formed on the first anode 741A1 and the second anode 741A2. The forming of the first EL layer 744A1 includes forming an EL layer 744A that emits various color lights that are mixed with blue light to form white light. The first EL layer 744A1 is substantially the same as the first multi-layered emission layer structure 244A1 of FIG. 2A and is thus not redundantly described here.

The forming of the first EL layer 744A1 may include forming the first EL layer 744A1 according to the photolithographic process. When the photolithographic process is used, first, a photoresist 770A is formed on the third anode 741A3 corresponding to the third sub pixel region B. The forming of the photoresist 770A may include applying a photoresist on the entire third anode 741A3 and performing exposure and development on the photoresist to form the photoresist 770A on the second EL layer 744A2 corresponding to the third sub pixel region B.

Next, a first EL layer 744A1 is formed on an anode 741A on which the photoresist 770A is formed. The first EL layer 744A1 is formed by depositing an organic light emitting material 749A. Since the photoresist 770A is formed in the third sub pixel region B, the organic light emitting material 749A is formed on the anode 741A in the first sub pixel region R and the second sub pixel region G and on the photoresist 770A in the third sub pixel region B.

Next, referring to FIG. 7B, the photoresist 770A is removed from the third sub pixel region B. When the photoresist 770A is removed, the organic light emitting material 749A formed on the photoresist 770A is also removed. The photoresist 770A may be formed of a material containing fluorine, and a developing solution and a stripper may also be formed a material containing fluorine. By using the developing solution and the stripper that contain fluorine, damage to the EL layer 744A may be minimized during the developing and removing of the photoresist 770A.

Then, referring to FIG. 7C, a second EL layer 744A2 is formed on the first EL layer 744A1 and the third anode 741A3.

Figure 8A:
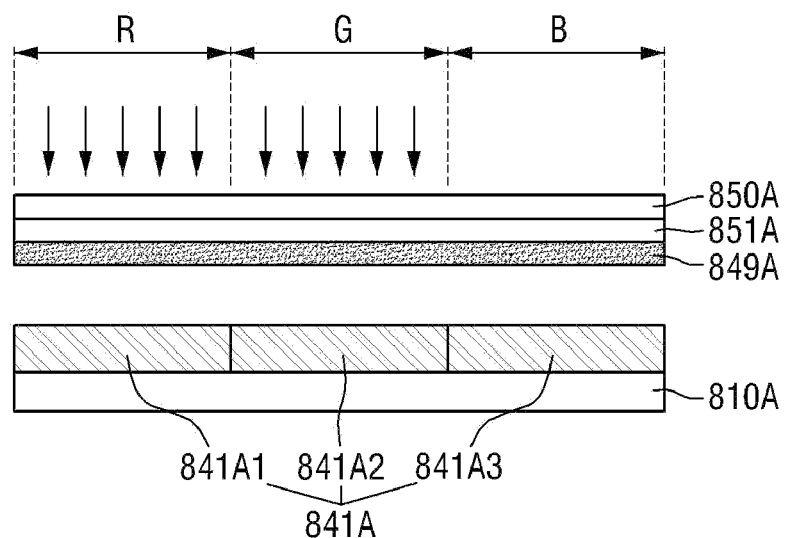
FIGS. 8A and 8C illustrate cross-sectional views of the exemplary organic light emitting display device during the steps of manufacturing such organic light emitting display device according to an exemplary embodiment of the present invention.
Figure 8B:
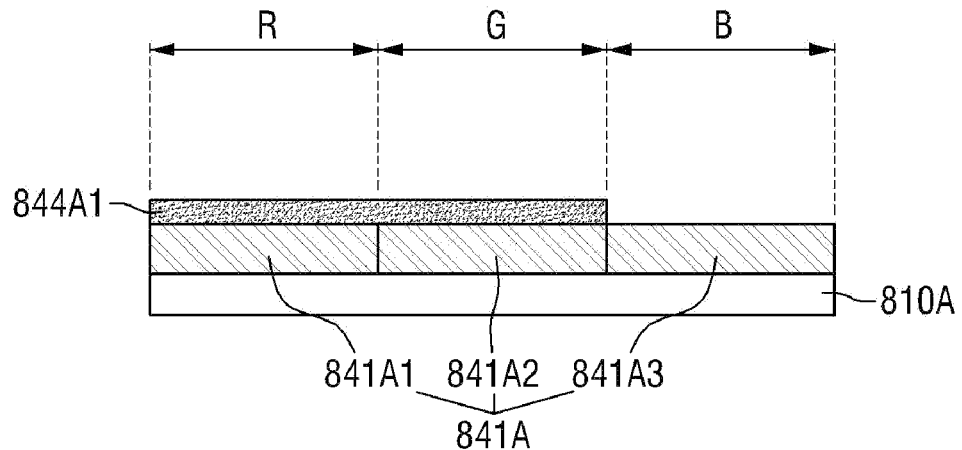
Figure 8C:
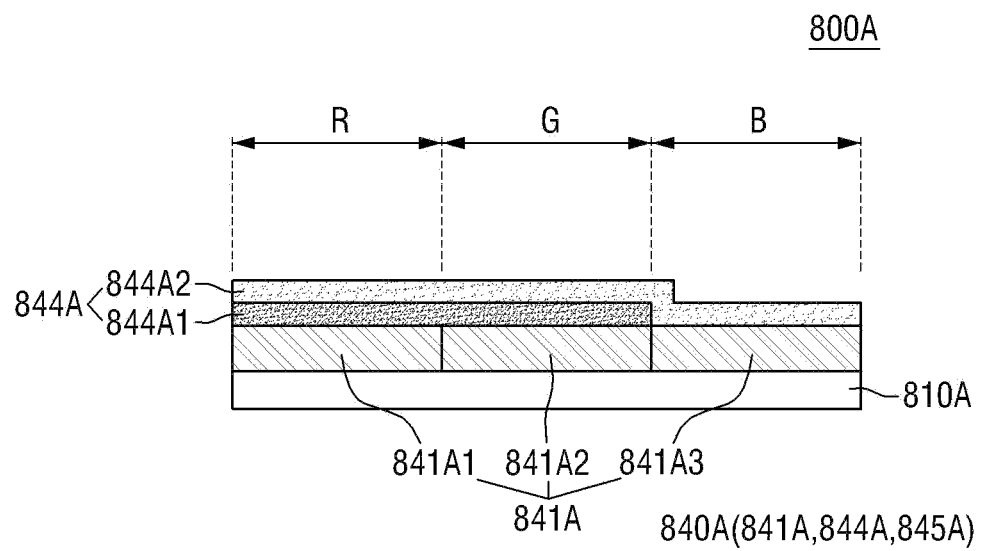

FIGS. 8A to 8C are cross-sectional views sequentially illustrating a method of manufacturing an organic light emitting display device according to another exemplary embodiment of the present invention.

First, referring to FIG. 8A, a first anode 841A1 and a second anode 841A2 are formed in a first sub pixel region R and a second sub pixel region G corresponding to a first region of a substrate 810A, respectively, and a third anode 841A3 is formed in a third sub pixel region B corresponding to a second region of the substrate 810A.

Next, a first EL layer 844A1 is formed on the first anode 841A1 and second anode 841A2. The forming of the first EL layer 844A1 includes forming an EL layer 844A that emits various color lights that are mixed with blue light to form white light. The first EL layer 844A1 is substantially the same as the first multi-layered emission layer structure 244A1 of FIG. 2A and is thus not redundantly described here.

The forming of the first EL layer 844A1 may include forming the first EL layer 844A1 using laser induced thermal imaging (LITI). Specifically, referring to FIG. 8A, in order to form the first EL layer 844A1 using LITI, a base substrate 850A on which a photoelectric conversion layer 851A and an organic light emitting material 849A which is to be transferred are formed is disposed on the first substrate 810A on which an anode 841A is formed.

Then, when a laser beam is irradiated onto the first sub pixel region R which is a red sub pixel region and the second sub pixel region G which is a green sub pixel region, photoelectric conversion occurs in the irradiated regions to weaken adhesion between the photoelectric conversion layer 851A and the organic light emitting material 849A and to transfer the organic light emitting material 849A to the first substrate 810A. As a result, as illustrated in FIG. 8B, the first EL layer 844A1 is formed in the first sub pixel region R and the second sub pixel region G.

Then, referring to FIG. 8C, a second EL layer 844A2 is formed on the first EL layer 844A1 and the third anode 841A3.

According to the one or more embodiments of the present invention, the following effects may be derived.

With a novel organic light emitting element, organic light emitting display device, and method of manufacturing the organic light emitting display device according to the present invention, the efficiency of the organic light emitting element may be improved to increase the lifespan thereof and reduce power consumption therein.

Also, according to the present invention, the efficiency of blue light may be improved using an organic light emitting element that employs a blue emission layer with an improved structure.

The above-described effects according to the present invention are not intended to limit the contents used herein, and further effects may be encompassed in this specification.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of manufacturing a display device, comprising:
   forming a plurality of anodes on a substrate;
   forming a blue EL layer in both a first area and a second area;
   forming a photoresist over the second area;
   forming a complementary EL layer over the blue EL layer and the photoresist;
   stripping the photoresist;
   forming a cathode such that the blue EL layer and the complementary EL layer are disposed between the anode and the cathode; and
   forming one or more color filter elements within at least a portion of the first area of the display device.

2. The method of claim 1, wherein forming one or more color filter elements includes forming a red color filter element and a green color filter element in the first area of the display device.

3. The method of claim 1, wherein the photoresist is developed using a developing solution containing fluorine.

4. The method of claim 1, wherein the photoresist is stripped using a stripper containing fluorine.

5. The method of claim 1, wherein forming the complementary EL layer comprises depositing an EL layer having a host doped with a red dopant and a green dopant.

6. The method of claim 1, wherein forming the complementary EL layer comprises depositing a stacked structure having a yellow EL layer and a green EL layer.

7. The method of claim 1, wherein forming the complementary EL layer comprises depositing a stacked structure having a red EL layer and a green EL layer.

8. The method of claim 1, wherein forming the blue EL layer comprises depositing an EL layer doped with a blue fluorescent dopant, and wherein forming the complementary EL layer comprises depositing a stacked structure of a red EL layer doped with a red phosphor dopant and a yellow EL layer doped with a yellow phosphor dopant.

9. The method of claim 1, wherein forming the blue EL layer comprises depositing an EL layer doped with a blue fluorescent dopant, and wherein forming the complementary EL layer comprises depositing a stacked structure of a green EL layer doped with a green phosphor dopant and a yellow EL layer doped with a yellow phosphor dopant.

10. A method of manufacturing a display device, comprising:
    forming a plurality of anodes on a substrate;
    forming a photoresist to substantially cover a second area of the substrate;
    forming a complementary EL layer over the substrate in the first area of the substrate and over the photoresist in the second area;
    stripping the photoresist;
    forming a blue EL layer over the substrate in the second area and over the complementary EL layer in the first area;
    forming a cathode such that the blue EL layer and the complementary EL layer are disposed between the anode and the cathode; and
    forming one or more color filter elements within at least a portion of the first area of the display device.

11. The method of claim 10, wherein forming one or more color filter elements includes forming a red color filter element and a green color filter element in the first area of the display device.

12. The method of claim 10, wherein the photoresist is developed using a developing solution containing fluorine.

13. The method of claim 10, wherein the photoresist is stripped using a stripper containing fluorine.

14. The method of claim 10, wherein forming the complementary EL layer comprises depositing an EL layer having a host doped with a red dopant and a green dopant.

15. The method of claim 10, wherein forming the complementary EL layer comprises depositing a stacked structure having a yellow EL layer and a green EL layer.

16. The method of claim 10, wherein forming the complementary EL layer comprises depositing a stacked structure having a red EL layer and a green EL layer.

17. The method of claim 10, wherein forming the blue EL layer comprises depositing an EL layer doped with a blue fluorescent dopant, and wherein forming the complementary EL layer comprises depositing a stacked structure of a red EL layer doped with a red phosphor dopant and a yellow EL layer doped with a yellow phosphor dopant.

18. The method of claim 10, wherein forming the blue EL layer comprises depositing an EL layer doped with a blue fluorescent dopant, and wherein forming the complementary EL layer comprises depositing a stacked structure of a green EL layer doped with a green phosphor dopant and a yellow EL layer doped with a yellow phosphor dopant.

* * * * *